(12) United States Patent
Kim et al.

(10) Patent No.: US 11,545,341 B2
(45) Date of Patent: Jan. 3, 2023

(54) PLASMA ETCHING METHOD AND SEMICONDUCTOR DEVICE FABRICATION METHOD INCLUDING THE SAME

(71) Applicant: SAMSUNG ELECTRONICS CO., LTD., Suwon-si (KR)

(72) Inventors: Yonghee Kim, Yongin-si (KR); Byunghun Han, Suwon-si (KR); Hyeongmo Kang, Hwaseong-si (KR); Donghyeon Na, Hwaseong-si (KR); Dougyong Sung, Seoul (KR); Seungbo Shim, Seoul (KR); Minjae Lee, Hwaseong-si (KR); Myungsun Choi, Hwaseong-si (KR); Minyoung Hur, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 394 days.

(21) Appl. No.: 16/891,157

(22) Filed: Jun. 3, 2020

(65) Prior Publication Data

US 2021/0104382 A1  Apr. 8, 2021

(30) Foreign Application Priority Data

Oct. 2, 2019 (KR) .................. 10-2019-0122524
Jan. 16, 2020 (KR) .................. 10-2020-0006150

(51) Int. Cl.
| | | |
|---|---|---|
| *H01J 37/32* | (2006.01) | |
| *H01L 21/683* | (2006.01) | |
| *H01L 21/3065* | (2006.01) | |
| *H03H 7/38* | (2006.01) | |

(52) U.S. Cl.
CPC .. *H01J 37/32183* (2013.01); *H01J 37/32091* (2013.01); *H01L 21/3065* (2013.01); *H01L 21/6833* (2013.01); *H03H 7/38* (2013.01); *H01J 2237/334* (2013.01)

(58) Field of Classification Search
CPC .......... H01J 37/32183; H01J 37/32091; H01J 2237/334; H01J 37/32706; H01L 21/3065; H01L 21/6833; H01L 21/31116; H03H 7/38
See application file for complete search history.

(56) References Cited

U.S. PATENT DOCUMENTS

| | | | |
|---|---|---|---|
| 7,679,133 B2 | 3/2010 | Son et al. | |
| 8,553,466 B2 | 10/2013 | Han et al. | |
| 8,559,235 B2 | 10/2013 | Yoon et al. | |
| 8,654,587 B2 | 2/2014 | Yoon et al. | |
| 8,685,267 B2 | 4/2014 | Yatsuda et al. | |

(Continued)

FOREIGN PATENT DOCUMENTS

| | | |
|---|---|---|
| KR | 10-1328800 B1 | 11/2013 |
| KR | 10-1989518 B1 | 6/2019 |

*Primary Examiner* — Renan Luque
(74) *Attorney, Agent, or Firm* — Lee IP Law, P.C.

(57) ABSTRACT

A plasma etching method and a semiconductor device fabrication method, the plasma etching method including providing a source power having a first single pulse to an electrostatic chuck in order to generate a plasma on a substrate; providing a first bias power having a burst pulse different from the first single pulse to concentrate the plasma on the substrate; and providing a second bias power having a second single pulse the same as the first single pulse to accelerate the plasma toward the substrate.

20 Claims, 30 Drawing Sheets

(56) References Cited

U.S. PATENT DOCUMENTS

| | | |
|---|---|---|
| 8,852,385 B2 | 10/2014 | Koshiishi et al. |
| 8,962,488 B2 | 2/2015 | Liao et al. |
| 9,030,101 B2 | 5/2015 | Valcore, Jr. et al. |
| 9,171,699 B2 | 10/2015 | Valcore, Jr. et al. |
| 9,336,999 B2 | 5/2016 | Morimoto et al. |
| 9,355,822 B2 | 5/2016 | Yamada et al. |
| 9,378,931 B2 | 6/2016 | Kwon et al. |
| 9,870,898 B2 | 1/2018 | Urakawa et al. |
| 10,250,217 B2 | 4/2019 | Nagami et al. |
| 10,395,897 B1 | 8/2019 | Wi et al. |
| 10,867,775 B2* | 12/2020 | Gu .................. H01J 37/32091 |
| 2009/0078678 A1* | 3/2009 | Kojima ............ H01L 21/31116 |
| | | 156/345.39 |
| 2011/0233648 A1 | 9/2011 | Seol et al. |
| 2013/0199727 A1* | 8/2013 | Iwata ............... H01J 37/32091 |
| | | 156/345.44 |
| 2017/0062190 A1 | 3/2017 | Lee et al. |
| 2018/0204708 A1* | 7/2018 | Tan .................. H01J 37/32715 |
| 2018/0261430 A1 | 9/2018 | Kawasaki |
| 2019/0043694 A1 | 2/2019 | Park |
| 2019/0066979 A1 | 2/2019 | Shoeb et al. |
| 2020/0294770 A1* | 9/2020 | Kubota .................... H05H 1/46 |

* cited by examiner

PLASMA ETCHING METHOD AND SEMICONDUCTOR DEVICE FABRICATION METHOD INCLUDING THE SAME

CROSS-REFERENCE TO RELATED APPLICATION

Korean Patent Application No. 10-2019-0122524, filed on Oct. 2, 2019, in the Korean Intellectual Property Office, and Korean Patent Application No. 10-2020-0006150, filed on Jan. 16, 2020, in the Korean Intellectual Property Office, both entitled: "Plasma Etching Method and Semiconductor Device Fabrication Method Including the Same," are incorporated by reference herein in its entirety.

BACKGROUND

1. Field

Embodiments relate to a plasma etching method and semiconductor device fabrication method including the same.

2. Description of the Related Art

A semiconductor device may be manufactured by employing a plurality of unit processes. The unit processes may include a deposition process, a photolithography process, and an etching process. A plasma may be commonly used to perform the deposition and etching processes. The plasma may treat substrates under high temperature conditions. A radio frequency power may be used to produce the plasma.

SUMMARY

The embodiments may be realized by providing a plasma etching method including providing a source power having a first single pulse to an electrostatic chuck in order to generate a plasma on a substrate; providing a first bias power having a burst pulse different from the first single pulse to concentrate the plasma on the substrate; and providing a second bias power having a second single pulse the same as the first single pulse to accelerate the plasma toward the substrate.

The embodiments may be realized by providing a plasma etching method including providing an electrostatic chuck with a source power to generate a plasma on a substrate; and matching an impedance of the source power with an impedance of the plasma, wherein matching the impedance of the source power with the impedance of the plasma includes: obtaining a first impedance by providing a single pulse of the source power; obtaining a second impedance by providing a two-level pulse of the source power; comparing the first impedance and the second impedance with each other to obtain an impedance difference; tuning a frequency of the source power in a low-level duration of the two-level pulse to obtain a first capacitance that removes an imaginary part of the impedance difference; calculating a second capacitance that removes a real part of the impedance difference; and matching the second impedance of the two-level pulse with the impedance of the plasma using the first capacitance and the second capacitance.

The embodiments may be realized by providing a semiconductor device fabrication method including allowing an electrostatic chuck to receive a substrate having an etch target layer; and etching the etch target layer, wherein etching the etch target layer includes providing a source power having a first single pulse to the electrostatic chuck to generate a plasma on the substrate; providing a first bias power having a burst pulse different from the first single pulse to concentrate the plasma on the substrate; and providing a second bias power having a second single pulse the same as the first single pulse to accelerate the plasma toward the substrate.

The embodiments may be realized by providing a plasma etching method including providing a source power having a first pulse; providing a first bias power having a second pulse that is synchronized with the first pulse; and providing a second bias power having a third pulse that is synchronized with the first and second pulses, wherein at least one of the first to third pulses has a pulse inclination, at least one of the first to third pulses has an inclined duration and a flat duration, the inclined duration being generated due to the pulse inclination, the flat duration being arranged continuously with the inclined duration, and the inclined duration has a power greater than half a power of the flat duration and less than the power of the flat duration.

The embodiments may be realized by providing a plasma etching method including providing a source power having a first pulse; providing a first bias power having a second pulse that is synchronized with the first pulse; and providing a second bias power having a third pulse that is synchronized with the first and second pulses, wherein at least one of the first pulse, the second pulse, and the third pulse has an inclined duration and a flat duration, the inclined duration being generated due to a pulse inclination, the flat duration being arranged continuously with the inclined duration.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
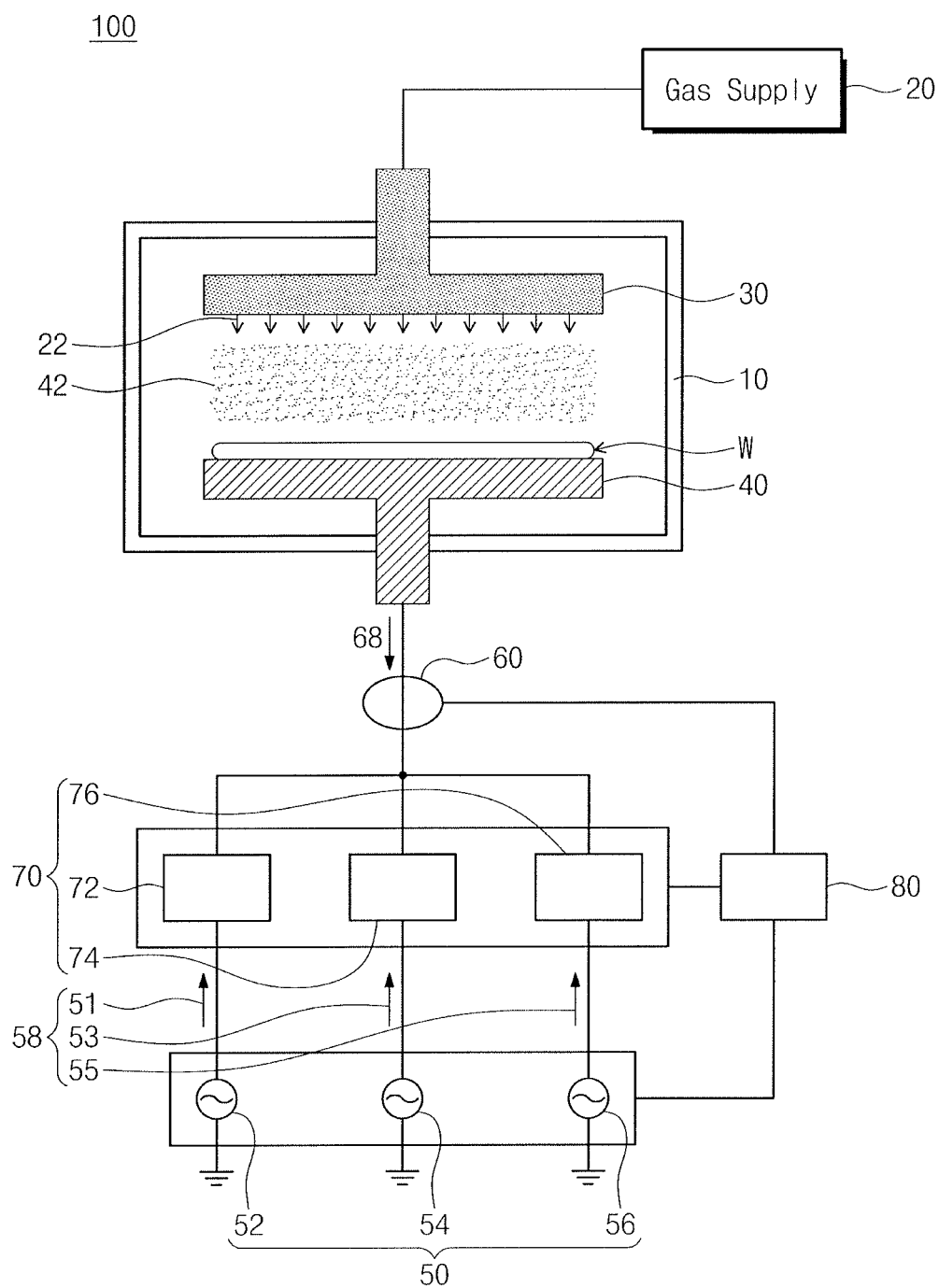
FIG. 1 illustrates a schematic diagram showing a plasma etching apparatus according to an embodiment.

FIG. 1 illustrates a schematic diagram showing a plasma etching apparatus according to an embodiment.

Referring to FIG. 1, the plasma etching apparatus 100 according to the present embodiment may be a capacitively coupled plasma (CCP) etching apparatus. In an implementation, the plasma etching apparatus 100 may include a chamber 10, a gas supply 20, a showerhead 30, an electrostatic chuck 40, a power supply 50, a current sensor 60, a radio-frequency (RF) matcher 70, and a tuning controller 80.

The chamber 10 may provide a processing space within which a semiconductor process (e.g., a plasma etching process) may be performed. In an implementation, the chamber 10 may have a hermetically sealed space of a certain size at the interior thereof. The chamber 10 may be variously shaped according to the size or the like of a substrate W or another suitable workpiece. In an implementation, the chamber 10 may have a cylindrical shape that corresponds to a disk shape of the substrate W.

The gas supply 20 may be installed outside the chamber 10. The gas supply 20 may supply the chamber 10 with a process gas 22. In an implementation, the process gas 22 may include, e.g., $CF_4$, $C_4F_6$, $C_4F_5$, COS, $CHF_3$, HBr, $SiCl_4$, $O_2$, $N_2$, $H_2$, $NF_3$, $SF_6$, He, or Ar. As used herein, the term "or" is not an exclusive term, e.g., "A or B" would include A, B, or A and B.

The showerhead 30 may be in an upper portion of the chamber 10. The showerhead 30 may be associated with (e.g., connected to) the gas supply 20. The showerhead 30 may provide the process gas 22 onto the substrate W.

The electrostatic chuck 40 may be in a lower portion of the chamber 10. The electrostatic chuck 40 may receive or accommodate the substrate W. The electrostatic chuck 40 may use an electrostatic voltage to fix or hold the substrate W.

The power supply 50 may be installed outside the chamber 10. The power supply 50 may be associated with the electrostatic chuck 40. The power supply 50 may provide the electrostatic chuck 40 with a radio-frequency (RF) power 58 to induce a plasma 42 on the substrate W. In an implementation, the power supply 50 may include a first power supply 52, a second power supply 54, and a third power supply 56. Based on a frequency of the RF power 58, the first power supply 52, the second power supply 54, and the third power supply 56 may respectively generate a source power 51, a first bias power 53, and a second bias power 55.

Figure 2:
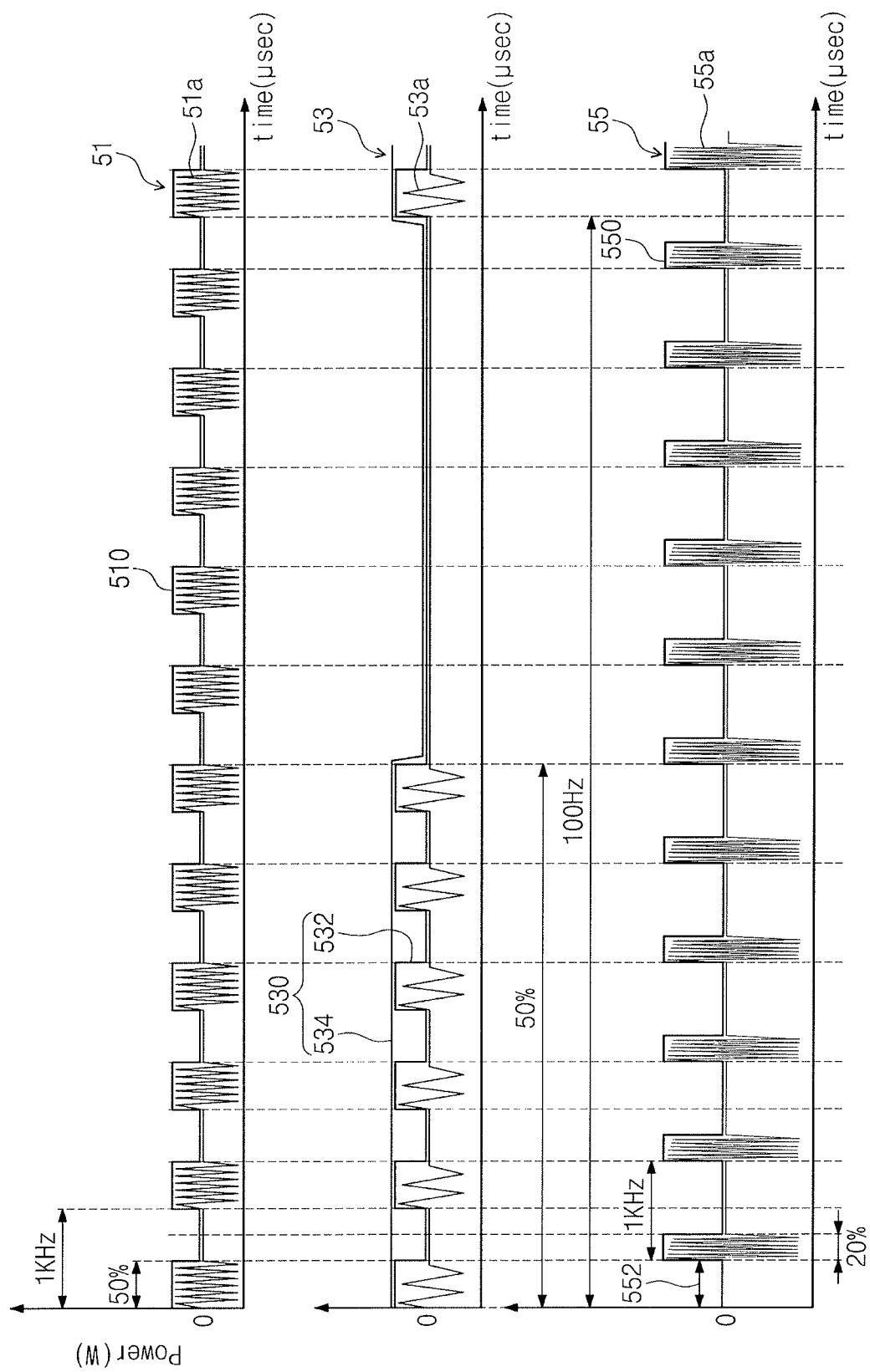
FIG. 2 illustrates graphs showing examples of a source power, a first bias power, and a second bias power for the plasma etching apparatus of FIG. 1.

FIG. 2 shows an example of the source power 51, the first bias power 53, and the second bias power 55 of the apparatus of FIG. 1. In FIG. 2, the Y axis represents power (watts) and the X axis represents time (microseconds).

Referring to FIGS. 1 and 2, the first power supply 52 may provide the electrostatic chuck 40 with the source power 51 to generate the plasma 42 on the substrate W. In an implementation, the source power 51 may have a first frequency 51a of about 60 MHz. The second power supply 54 may supply the electrostatic chuck 40 with the first bias power 53 to concentrate the plasma 42 on the substrate W. The first bias power 53 may increase an ion energy of the plasma 42. In an implementation, the first bias power 53 may have a second frequency 53a of about 2 MHz. The third power supply 56 may supply the second bias power 55 to accelerate the plasma 42 toward the substrate W. In an implementation, the second bias power 55 may have a third frequency 55a of about 400 KHz.

Referring to FIG. 2, the source power 51, the first bias power 53, and the second bias power 55 may be pulsed. In an implementation, the source power 51 may be pulsed to a single level. The source power 51 may have, e.g., a first single pulse 510. The first single pulse 510 may be a single level pulse. In addition, the first single pulse 510 may be an envelope of the first frequency 51a. The first single pulse 510 may have a pulse frequency of about 1 KHz. The first single pulse 510 may have a duty cycle of about 50%. The first single pulse 510 may help reduce deposition of a polymer layer on the substrate W. The term "level" may refer to power or wattage.

The first bias power 53 may be a high frequency bias power. The first bias power 53 may be synchronized with the source power 51. The first bias power 53 may be pulsed differently from the source power 51. In an implementation, the first bias power 53 may be pulsed in multiple. The first bias power 53 may have, e.g., a burst pulse 530. In an implementation, the burst pulse 530 may include a double pulse. The burst pulse 530 may be synchronized with the first single pulse 510. The burst pulse 530 may help control deposition of a polymer layer and etching of the substrate W to increase an etching rate of the substrate W and a depth of a channel hole (see 200 of FIG. 8). In an implementation, the burst pulse 530 may include a main pulse 532 and a sub-pulse 534.

The main pulse 532 may be an envelope of the second frequency 53a. The main pulse 532 may have the same pulse frequency as that of the first single pulse 510. For example, the main pulse 532 may have a pulse frequency of about 1 KHz. The main pulse 532 may have the same duty cycle as that of the first single pulse 510. The main pulse 532 may have a duty cycle of about 50%.

The sub-pulse 534 may be an envelope of the main pulse 532. The sub-pulse 534 may have a pulse frequency less than that of the main pulse 532. The sub-pulse 534 may have a pulse frequency of about 100 Hz. In an implementation, the sub-pulse 534 may have a duty cycle of about 50%.

The second bias power 55 may be a low frequency bias power. The second bias power 55 may have a second single pulse 550. The second single pulse 550 may be an envelope of the third frequency 55a. The second single pulse 550 may have the same pulse frequency as that of the first single pulse 510 and that of the main pulse 532. The second single pulse 550 may have a pulse frequency of about 1 KHz. The second single pulse 550 may have a duty cycle less than that of the first single pulse 510 and less than that of the main pulse 532. In an implementation, the second single pulse 550 may have a duty cycle of about 20%. The second single pulse 550 may have a different phase from that of the first single pulse 510 and that of the main pulse 532. In an implementation, the second single pulse 550 may have a phase shift 552. The phase shift 552 may correspond to a half-wavelength (λ/2) of the first single pulse 510. In an implementation, the second single pulse 550 may be provided delayed as much as the half-wavelength (λ/2) of the first single pulse 510 and of the main pulse 532. The delayed second single pulse 550 may help increase uniformity of the ion energy of the plasma 42 and may stabilize the ion energy of the plasma 42. In FIG. 2, the left (Y) axis is shown as being aligned with a leading edge of the high-power portion of the pulses 510, 532.

Figure 3A:
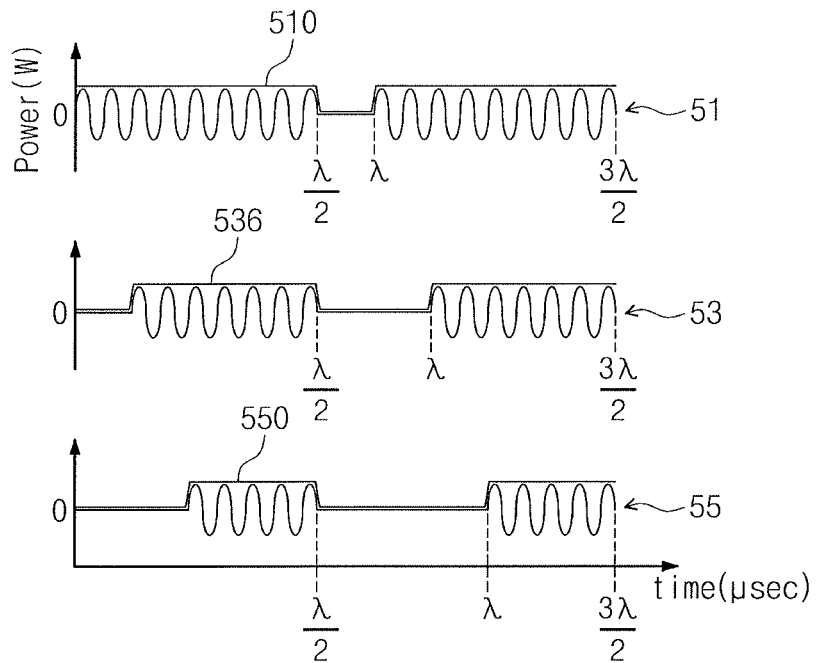
FIGS. 3A and 3B illustrate graphs showing examples of a source power, a first bias power, and a second bias power for the plasma etching apparatus of FIG. 1.
Figure 3B:
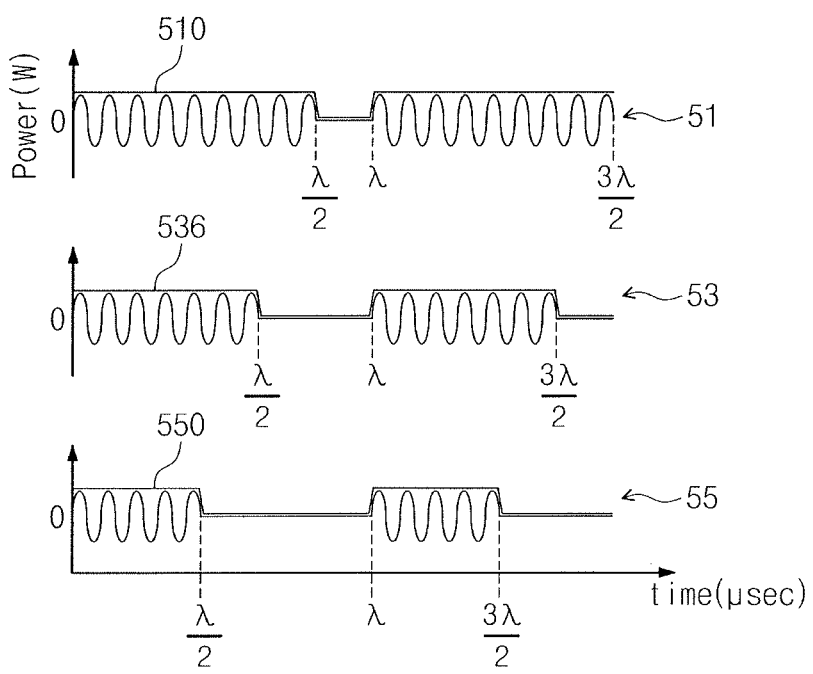

FIGS. 3A and 3B show examples of the source power 51, the first bias power 53, and the second bias power 55 of the apparatus of FIG. 1.

Referring to FIGS. 3A and 3B, each of the source power 51, the first bias power 53, and the second bias power 55 may be pulsed to have a single pulse. In an implementation, the source power 51 may have a first single pulse 510, the first bias power 53 may have a third single pulse 536, and the second bias power 55 may have a second single pulse 550. The first, second, and third single pulses 510, 550, and 536 may each have a pulse frequency of about 1 KHz. The first, second, and third single pulses 510, 550, and 536 may have different duty cycles from each other. The duty cycle of the first single pulse 510 may be greater than those of the second and third single pulses 550 and 536. The duty cycle of the third single pulse 536 may be less than that of the first single pulse 510 and greater than that of the second single pulse 550.

The first, second, and third single pulses 510, 550, and 536 may help control the ion energy of the plasma 42 and may help enhance directionality of positive ions of the plasma 42. The first, second, and third single pulses 510, 550, and 536 may have phases that are aligned at their every half-wavelength λ/2 or at their every wavelength λ. In an implementation, referring to FIG. 3A, the phases of the first, second, and third single pulses 510, 550, and 536 may be aligned at their every half-wavelength λ/2 and 3λ/2. In an implementation, referring to FIG. 3B, the phases of the first, second, and third single pulses 510, 550, and 536 may be aligned at their every wavelength 0 and λ.

Figure 4:
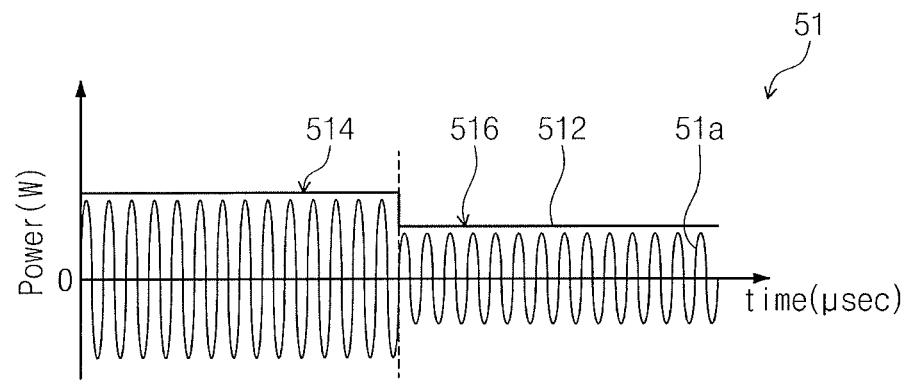
FIG. 4 illustrates a graph showing an example of a source power for the plasma etching apparatus of FIG. 1.

FIG. 4 shows an example of the source power 51 of the apparatus of FIG. 1.

Referring to FIGS. 1 and 4, the source power 51 may be pulsed to a multiple level. In an implementation, the source power 51 may have a two-level pulse 512. The two-level pulse 512 may be an envelope of the first frequency 51a. The two-level pulse 512 may help increase stability of the plasma 42. The two-level pulse 512 may have a high-level duration 514 and a low-level duration 516. The high-level duration 514 may be a power greater than that of the low-level duration 516. The high-level duration 514 may be a first on-state. The low-level duration 516 may have a power less than the high-level duration 514 and greater than an off-state (e.g., 0). The low-level duration 516 may be a second on-state.

Referring back to FIG. 1, the current sensor 60 may be between the electrostatic chuck 40 and the power supply 50. The current sensor 60 may detect currents of the RF power 58. In addition, the current sensor 60 may detect, from the chamber 10 and the electrostatic chuck 40, a reflected power 68 of the source power 51, the first bias power 53, and the second bias power 55.

The RF matcher 70 may be between the current sensor 60 and the power supply 50. Based on a detection signal generated from the current sensor 60 that has detected the reflected power 68, the RF matcher 70 may match an impedance of the RF power 58 with an impedance of the plasma 42 in the chamber 10, thereby removing the reflected power 68. The impedance of the plasma 42 may include an impedance of the chamber 10, an impedance of the electrostatic chuck 40, and an impedance of their connecting cable. When the impedance of the RF power 58 matches the impedance of the plasma 42, production efficiency of the plasma 42 may increase to maximum without loss of the RF power 58. In an implementation, the RF matcher 70 may include a first RF matcher 72, a second RF matcher 74, and a third RF matcher 76. The first RF matcher 72 may match the impedance of the source power 51 with the impedance of the plasma 42, thereby removing the reflected power 68. The second RF matcher 74 may match the impedance of the first bias power 53 with the impedance of the plasma 42, thereby removing the reflected power 68. The third RF matcher 76 may match the impedance of the second bias power 55 with the impedance of the plasma 42, thereby removing the reflected power 68.

The tuning controller 80 may be associated with the current sensor 60, the RF matcher 70, and the power supply 50. The tuning controller 80 may be configured such that a current detection signal from the current sensor 60 is used to calculate the impedance of the RF power 58. The tuning controller 80 may control the RF matcher 70 to match the impedance of the RF power 58 with the impedance of the plasma 42.

Figure 5:
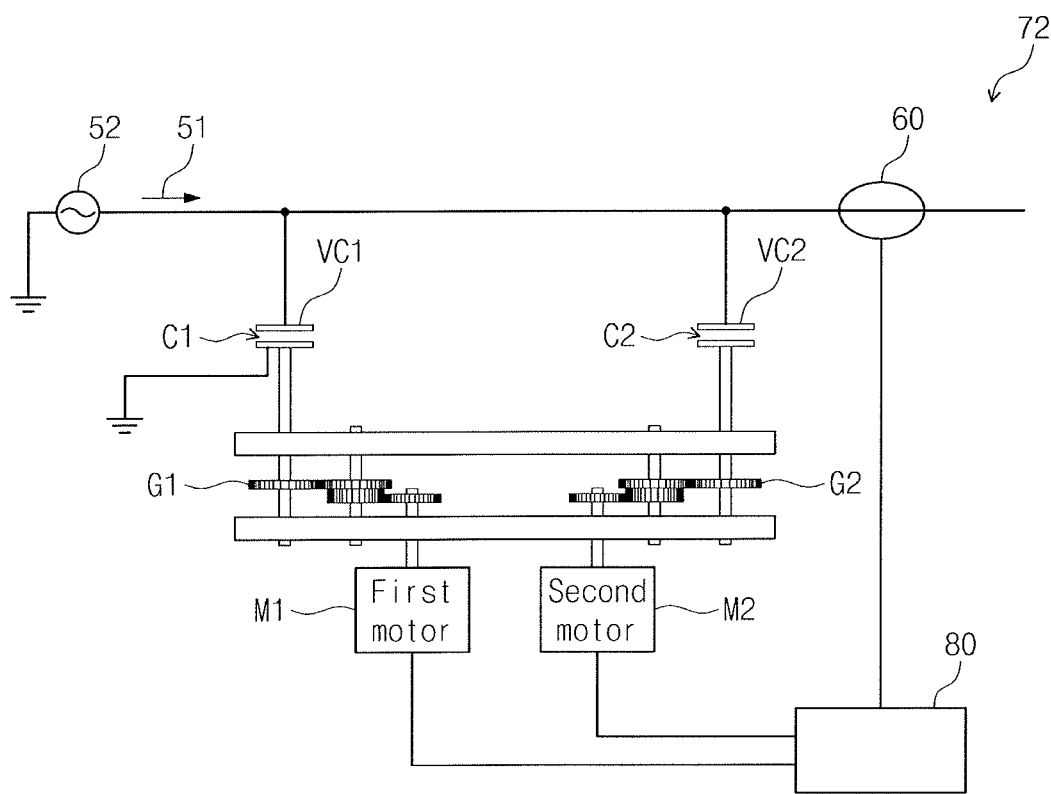
FIG. 5 illustrates a schematic diagram showing an example of a first radio frequency matcher of FIG. 1.

FIG. 5 shows an example of the first RF matcher 72 of FIG. 1.

Referring to FIG. 5, the first RF matcher 72 may include a first variable capacitor VC1, a first motor M1, first gears G1, a second variable capacitor VC2, a second motor M2, and second gears G2.

The first variable capacitor VC1 may be connected in parallel to the first power supply 52. The first variable capacitor VC1 may have a first capacitance C1 that is controlled by the first motor M1 and the first gears G1. The first variable capacitor VC1 may be electrically grounded.

The first motor M1 may be engaged with the tuning controller 80. The first motor M1 may generate a rotating power in response to a control signal from the tuning controller 80.

The first gears G1 may be connected between the first motor M1 and the first variable capacitor VC1. The rotating power from the first motor M1 may be used by the first gears G1 to adjust the first capacitance C1 of the first variable capacitor VC1.

The second variable capacitor VC2 may be connected in parallel to the first power supply 52. The second variable capacitor VC2 may have a second capacitance C2 that is controlled by the second motor M2 and the second gears G2.

The second motor M2 may be engaged with the tuning controller 80. The second motor M2 may generate a rotating power in response to a control signal from the tuning controller 80.

The second gears G2 may be connected between the second motor M2 and the second variable capacitor VC2. The rotating power from the second motor M2 may be used by the second gears G2 to adjust the second capacitance C2 of the second variable capacitor VC2.

The tuning controller 80 may adjust the first capacitance C1 of the first variable capacitor VC1 and the second capacitance C2 of the second variable capacitor VC2, thereby matching the impedance of the source power 51 with the impedance of the plasma 42.

In an implementation, the tuning controller 80 may adjust a third capacitance and a fourth capacitance of the second RF matcher 74, thereby matching the impedance of the first bias power 53 with the impedance of the plasma 42. In an implementation, the tuning controller 80 may adjust a fifth capacitance and a sixth capacitance of the third RF matcher 76, thereby matching the impedance of the second bias power 55 with the impedance of the plasma 42.

It will be described below a semiconductor device fabrication method using the plasma etching apparatus 100 configured as discussed above.

Figure 6:
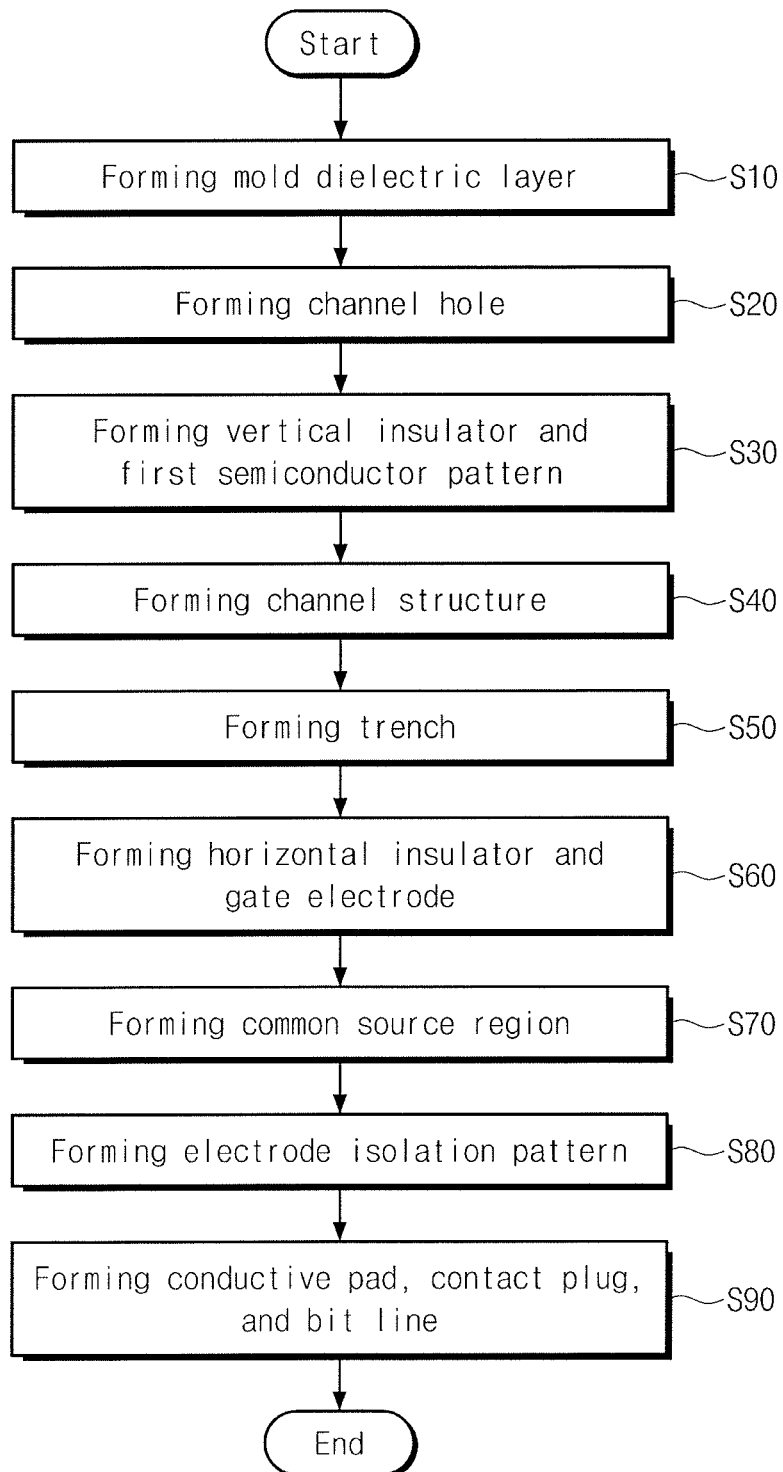
FIG. 6 illustrates a flow chart of a semiconductor device fabrication method according to an embodiment.

FIG. 6 shows a flow chart of a semiconductor device fabrication method according to an embodiment. FIGS. 7 to 15 illustrate cross-sectional views of stages in a semiconductor device fabrication method according to an embodiment.

Figure 7:
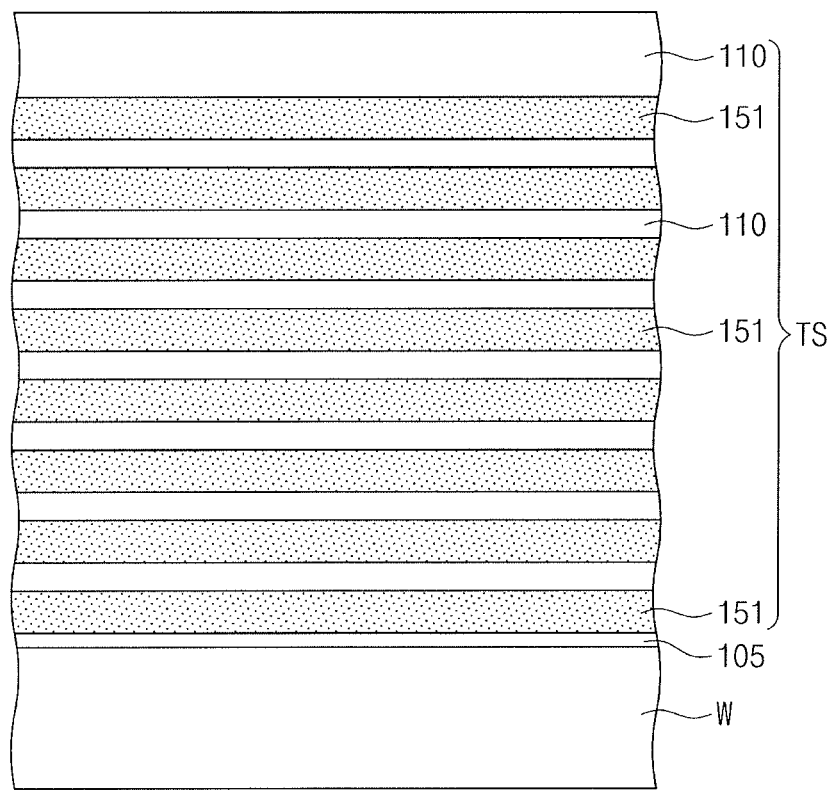
FIGS. 7 to 15 illustrate cross-sectional views of stages in a semiconductor device fabrication method according to an embodiment.

Referring to FIGS. 6 and 7, a film deposition apparatus may form a mold dielectric layer TS on the substrate W (S10). In an implementation, the substrate W may include a silicon wafer. A lower dielectric layer 105 may be formed between the substrate W and the mold dielectric layer TS. In an implementation, the lower dielectric layer 105 may include silicon oxide. In an implementation, the lower dielectric layer 105 may be formed by thermal oxidation. In an implementation, the lower dielectric layer 105 may be formed by chemical vapor deposition.

The mold dielectric layer TS may be deposited using thermal chemical vapor deposition (CVD), plasma enhanced CVD, physical vapor deposition (PVD), or atomic layer deposition (ALD). The mold dielectric layer TS may be thicker than the lower dielectric layer 105. In an implementation, the mold dielectric layer TS may include sacrificial layers 151 and upper dielectric layers 110. The sacrificial layers 151 and the upper dielectric layers 110 may be formed alternately with each other. The sacrificial layers 151 and the upper dielectric layers 110 may be formed thicker than the lower dielectric layer 105.

The sacrificial layers 151 may be formed of a material that can be etched with an etch selectivity with respect to the upper dielectric layers 110. In an implementation, the sacrificial layers 151 may include polysilicon, silicon oxide, silicon carbide, silicon oxynitride, or silicon nitride. In an implementation, the sacrificial layers 151 may have the same thickness as each other.

The upper dielectric layer 110 may be formed between the sacrificial layers 151. In an implementation, the upper dielectric layers 110 may include polysilicon, silicon oxide, silicon carbide, silicon oxynitride, or silicon nitride, and the material of the upper dielectric layers 110 may be different from that of the sacrificial layers 151. An uppermost one of the upper dielectric layers 110 may be formed thicker than an uppermost one of the sacrificial layers 151. In an implementation, the sacrificial layers 151 may include silicon nitride, and the upper dielectric layers 110 may include silicon oxide. Therefore, the mold dielectric layer TS may be a composite layer of silicon nitride and silicon oxide. In an implementation, the mold dielectric layer TS may be a single layer of silicon oxide.

Figure 8:
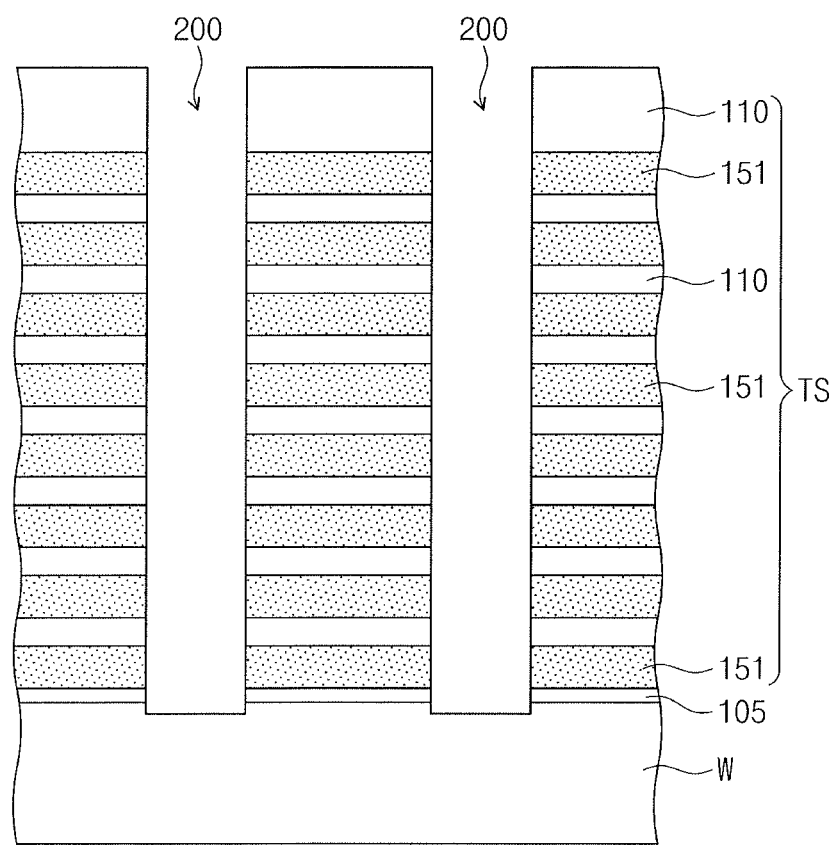

Referring to FIGS. 1 and 8, the plasma etching apparatus 100 may form channel holes 200 in the mold dielectric layer TS (S20). In an implementation, the channel holes 200 may be formed by photolithography and etching processes performed on the mold dielectric layer TS. The photolithography process may form a first mask pattern having openings that define regions where the channel holes 200 will be formed. The etching process may remove portions of the mold dielectric layer TS that are exposed by the first mask pattern. The etching process on the mold dielectric layer TS may include a dry etching process. A top surface of the substrate W may be partially etched during the etching process. Therefore, the top surface of the substrate W may be recessed. In an implementation, the etching process may form the channel holes 200 each having a width at its lower portion (e.g., proximate to the substrate W) less than a width at its upper portion (e.g., distal to the substate W). Thereafter, the first mask pattern may be removed. In an implementation, the etching process may form the channel holes 200 each having a width at its lower portion substantially the same as a width at its upper portion.

The thicker the mold dielectric layer TS, the deeper the channel holes 200. An increase in depth of the channel holes 200 may increase integration of a semiconductor device. The depth of the channel holes 200 may increase in proportion to an etching rate of the mold dielectric layer TS.

The following will discuss a method of increasing the etching rate of the mold dielectric layer TS.

Figure 16:
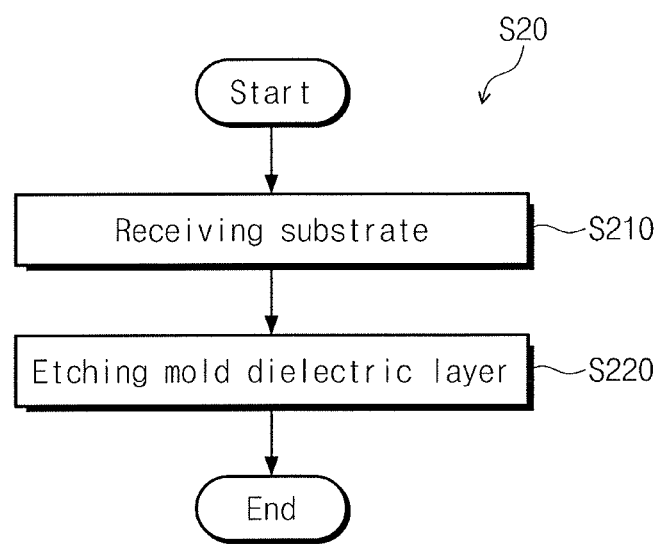
FIG. 16 illustrates a flow chart of an example of a step for forming a channel hole of FIG. 8.

FIG. 16 is a flowchart of the step S20 for forming the channel holes 200 of FIG. 8.

Referring to FIGS. 1 and 16, when the substrate W is provided in the chamber 10, the electrostatic chuck 40 may receive the substrate W (S210). The electrostatic chuck 40 may use an electrostatic voltage to fix the substrate W.

The mold dielectric layer TS may be etched with the plasma 42 that is induced by the RF power 58 provided from the power supply 50 (S220). The mold dielectric layer TS may be an etch target layer on the substrate W. The gas supply 20 may provide the process gas 22 into the chamber 10.

Figure 17:
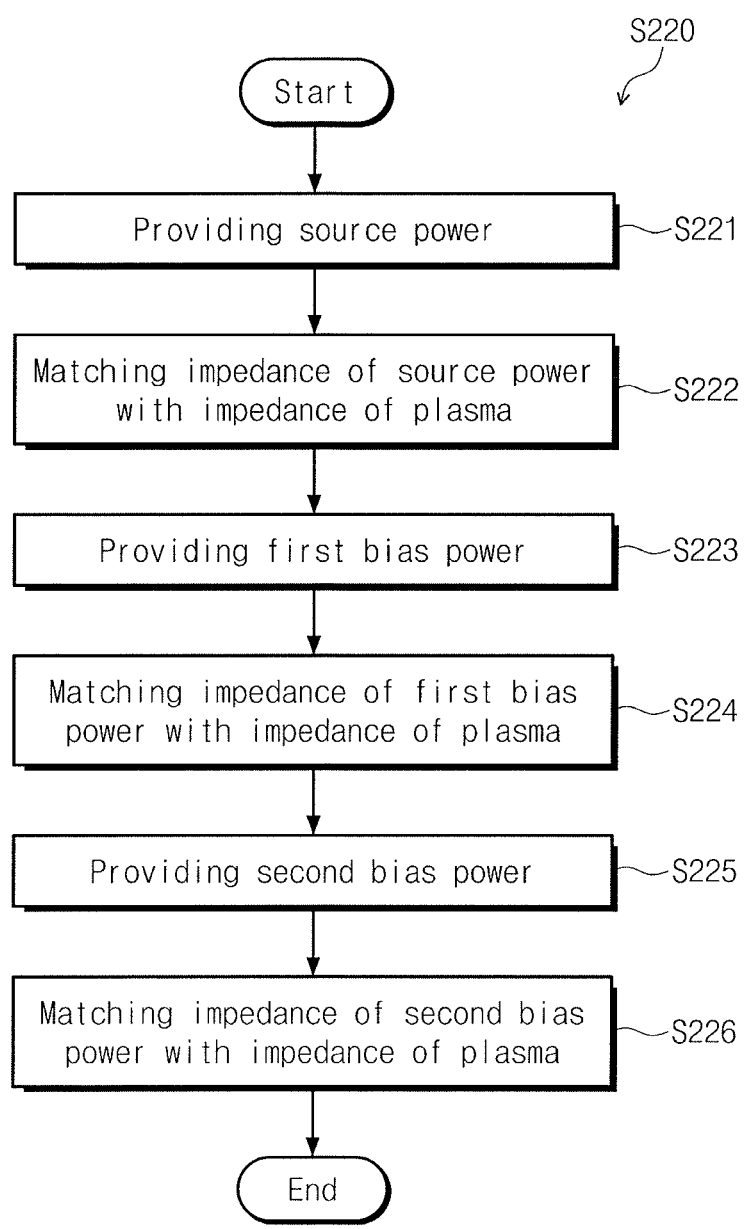
FIG. 17 illustrates a flow chart of an example of a step for etching a mold dielectric layer of FIG. 7.

FIG. 17 is a flowchart of the step S220 for etching the mold dielectric layer TS of FIG. 7.

Referring to FIGS. 1 and 17, the first power supply 52 may provide the electrostatic chuck 40 with the source power 51 to generate the plasma 42 on the substrate W (S221). An intensity of the plasma 42 may increase in proportion to the source power 51. The source power 51 may be, e.g., about 5 KW to 10 KW.

The first RF matcher 72 may match the impedance of the source power 51 with the impedance of the plasma 42 (S222). When the source power 51 is pulsed to a single level, the first RF matcher 72 may remove the reflected power 68 by matching a first impedance (see 511 of FIG. 19) of the first single pulse (see 510 of FIG. 2) of the source power 51 with the impedance of the plasma 42. The first single pulse 510 may be an envelope of the first frequency 51a. The first single pulse 510 may be a single level pulse. In an implementation, the first single pulse 510 may have a pulse frequency of about 1 KHz. When the source power 51 is pulsed to a multiple level, the first RF matcher 72 may remove the reflected power 68 by matching a second impedance (see 513 of FIG. 19) of the two-level pulse (see 512 of FIG. 4) of the source power 51 with the impedance of the plasma 42. The two-level pulse 512 may be an envelope of the first frequency 51a. The two-level pulse 512 may have the high-level duration 514 and the low-level duration 516. The high-level duration 514 may have a power greater than that of the low-level duration 516. When the power of the low-level duration 516 is zero, the second impedance 513 may be the same as the first impedance 511. When the power of the low-level duration 516 is greater than zero, the second impedance 513 may be different from the first impedance 511. In an implementation, when the first impedance 511 is the same as the second impedance 513, the power of the low-level duration 516 may generate the reflected power 68 such that the second impedance 513 may not match the impedance of the plasma 42.

The following will explain a way in which the second impedance 513 of the two-level pulse 512 and the impedance of the plasma 42 are matched with each other based on the power of the low-level duration 516.

Figure 18:
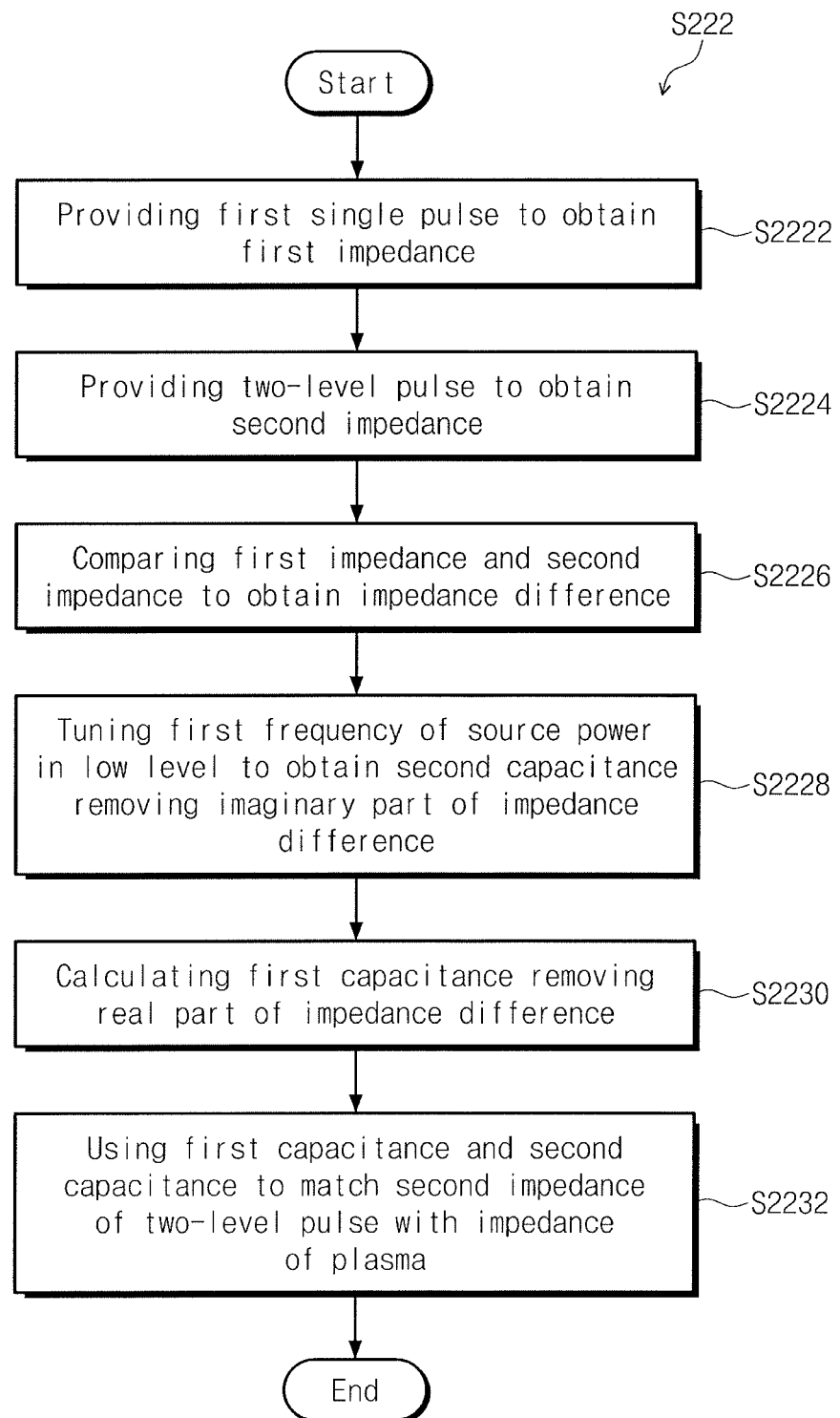
FIG. 18 illustrates a flow chart of an example of a step for matching an impedance of the source power of FIG. 4 with an impedance of plasma.
Figure 19:
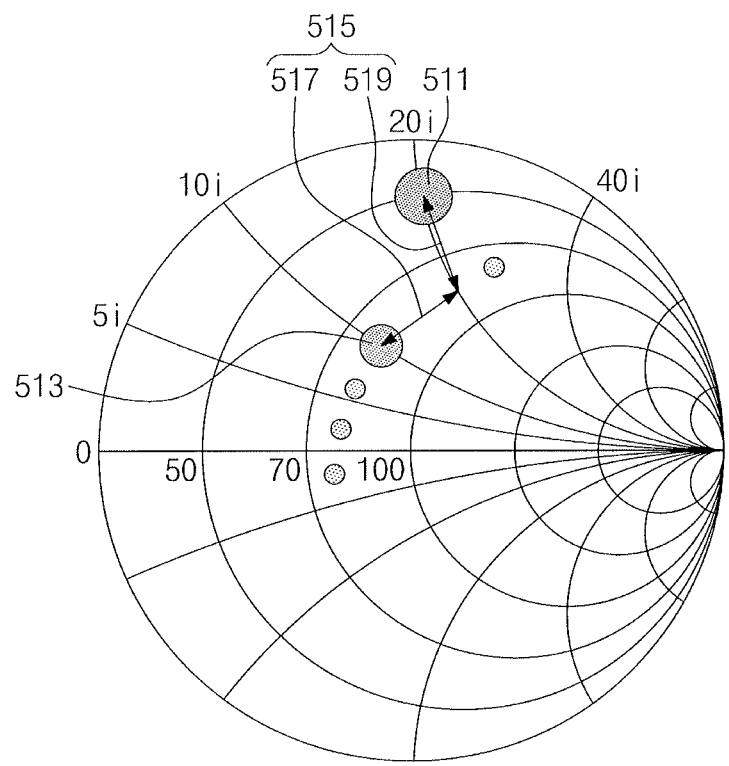
FIG. 19 illustrates a Smith chart showing examples of a first impedance of a first single pulse depicted in FIG. 2 and a second impedance of a two-level pulse depicted in FIG. 4.

FIG. 18 is a flowchart of the step S222 for matching the impedance of the source power 51 of FIG. 4 with the impedance of the plasma 42. FIG. 19 shows examples of the first impedance 511 of the first single pulse 510 depicted in FIG. 2 and the second impedance 513 of the two-level pulse 512 depicted in FIG. 4.

Referring to FIGS. 18 and 19, the first power supply 52 may provide the first single pulse 510 to obtain the first impedance 511 of the first single pulse 510 (S2222). When the current sensor 60 does not detect the reflected power 68, the tuning controller 80 may obtain the first impedance 511 that matches the impedance of the plasma 42. In an implementation, the first impedance 511 may be a reference impedance. The first impedance 511 may be expressed by a real part and an imaginary part. In an implementation, the first impedance 511 may be about 50+20 i Ω.

The first power supply 52 may provide the two-level pulse 512 to obtain the second impedance 513 of the two-level pulse 512 (S2224). The obtained second impedance 513 may be different from the first impedance 511. In an implementation, the high-level duration 514 of the two-level pulse 512 may have the same power as that of the first single pulse 510. The second impedance 513 may correspond to an impedance of the high-level duration 514 and the low-level duration 516 of the two-level pulse 512. In an implementation, the second impedance 513 may be about 80+10 i Ω.

The tuning controller 80 may compare the first impedance 511 and the second impedance 513 with each other to obtain an impedance difference 515 (S2226). The impedance difference 515 may include a real part 519 and an imaginary part 517. For example, the impedance difference 515 may be about 30+10 i Ω.

The first power supply 52 may tune the first frequency 51a of the source power 51 in the low-level duration 516 to obtain the second capacitance C2 that removes the imaginary part 517 of the impedance difference 515 (S2228). The first frequency 51a of the source power 51 in the low-level duration 516 may be tuned to about 50 MHz to about 70 MHz. The tuning controller 80 may use the frequency tuning of the source power 51 to obtain the real part 519 of the impedance difference 515 from which the imaginary part 517 is removed. The real part 519 of the impedance difference 515 may be about 30Ω. In addition, the tuning controller 80 may obtain the second capacitance C2 of the first RF matcher 72, which second capacitance C2 removes the imaginary part 517 of the impedance difference 515.

The tuning controller 80 may calculate the first capacitance C1 that removes the real part 519 of the impedance difference 515 (S2230).

Figure 20:
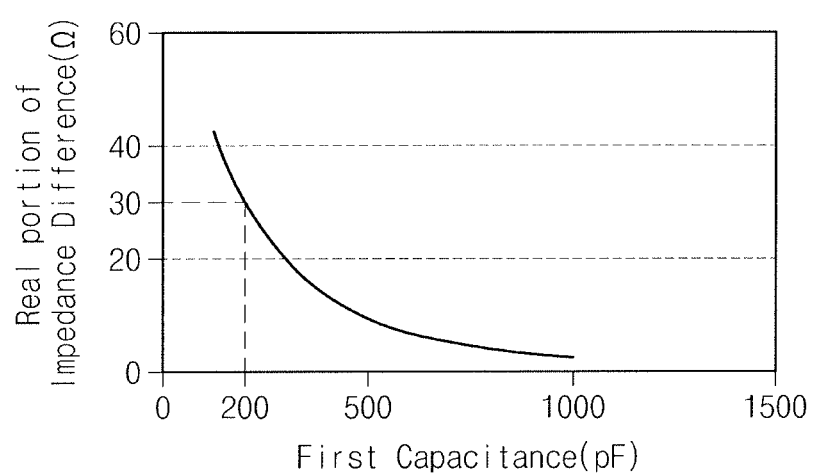
FIG. 20 illustrates a graph showing a first capacitance depending on an impedance difference.

FIG. 20 shows how the real part 519 of the impedance difference 515 depends on the first capacitance C1.

Referring to FIG. 20, the first capacitance C1 may be in inverse proportion to the real part 519 of the impedance difference 515. When the impedance difference 515 is about 30Ω, the first capacitance C1 may be calculated to about 200 pF.

Figure 21:
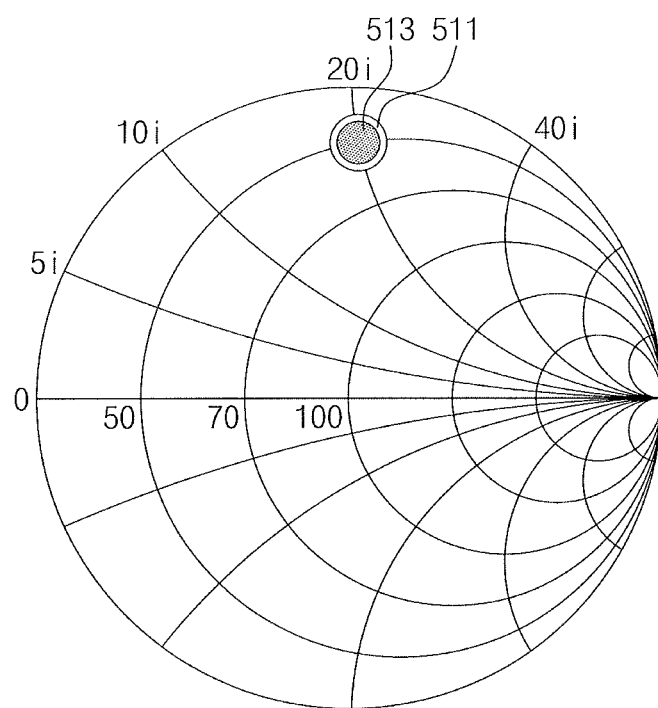
FIG. 21 illustrates a Smith chart showing how a first impedance and a second impedance that are controlled by a tuning controller depicted in FIG. 1.

FIG. 21 shows the first impedance 511 and the second impedance 513 without the impedance difference 515 of FIG. 19.

When the first capacitance C1 calculated with reference to FIGS. 19 to 21 is adjusted, and when the impedance difference 515 is removed, the second impedance 513 may approach or overlap the first impedance 511.

Referring back to FIG. 18, the first RF matcher 72 may use the first capacitance C1 and the second capacitance C2 to match the second impedance 513 of the two-level pulse 512 with the impedance of the plasma 42 (S2232).

Referring to FIGS. 1 and 17, the second power supply 54 may provide the electrostatic chuck 40 with the first bias power 53 to concentrate the plasma 42 on the substrate W (S223). The first bias power 53 may increase the intensity of the plasma 42 and an etching rate of the substrate W. In an implementation, the first bias power 53 may be about 10 KW to 20 KW. The first bias power 53 may have the burst pulse 530. The burst pulse 530 may include the main pulse 532 and the sub-pulse 534. The main pulse 532 may be an envelope of the second frequency 53a. The main pulse 532 may have the same pulse frequency as that of the first single pulse 510. In an implementation, the main pulse 532 may have a pulse frequency of about 1 KHz. The sub-pulse 534 may be an envelope of the main pulse 532. The sub-pulse 534 may have a pulse frequency less than that of the main pulse 532. In an implementation, the sub-pulse 534 may have a pulse frequency of about 100 Hz.

If the first bias power 53 were to be pulsed at only the pulse frequency of the main pulse 532, an upper clogging or overhang could occur at an upper portion of the channel hole 200. The sub-pulse 534 may help prevent the upper clogging or overhang of the channel hole 200. The sub-pulse 534 may help increase the etching rate of the mold dielectric layer TS, based on the duty cycle of the sub-pulse 534.

Figure 22:
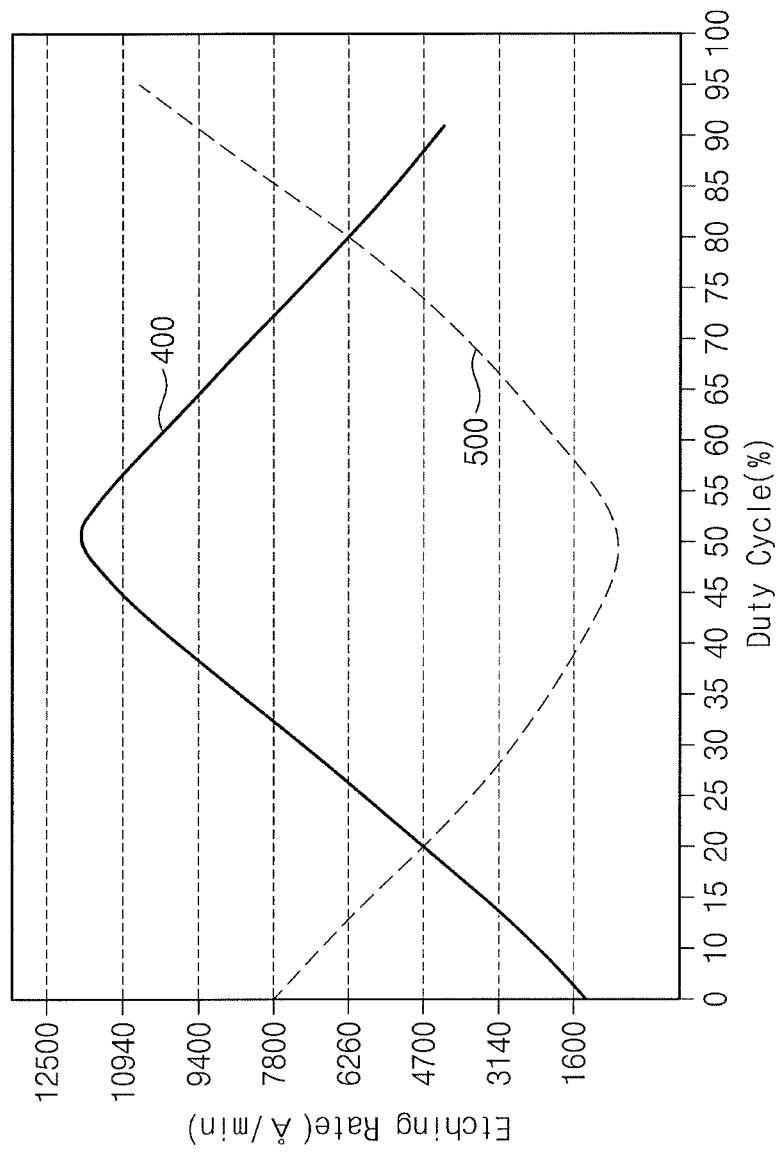
FIG. 22 illustrates a graph showing how vertical and horizontal etching rates change with a duty cycle of a sub-pulse depicted in FIG. 2.

FIG. 22 shows how vertical and horizontal etching rates 400 and 500 of the mold dielectric layer TS change with the duty cycle of the sub-pulse 534.

Referring to FIG. 22, depending on the duty cycle of the sub-pulse 534, the vertical etching rate 400 of the mold dielectric layer TS may have a Gaussian shape, and the horizontal etching rate 500 of the mold dielectric layer TS may have an oven shape or a bowl shape.

The vertical etching rate 400 may be an etching rate in a depth direction of the mold dielectric layer TS. The vertical etching rate 400 may be in proportion to the duty cycle of about 0% to about 50% and in inverse proportion to the duty cycle of about 50% to about 100%.

The horizontal etching rate 500 may be an etching rate at a sidewall of the mold dielectric layer TS. The horizontal etching rate 500 may be in inverse proportion to the duty cycle of about 0% to about 50% and in proportion to the duty cycle of about 50% to about 100%.

In an implementation, the sub-pulse 534 may have a duty cycle of about 20% to about 80%. If the sub-pulse 534 were to have a duty cycle less than about 20% or greater than about 80%, the horizontal etching rate 500 could be greater than the vertical etching rate 400. If the horizontal etching rate 500 were to be greater than the vertical etching rate 400, a sidewall of the channel hole 200 in the mold dielectric layer TS could be over-etched to cause bowing defects of the channel hole 200 or leaning defects of the mold dielectric layer TS. When the sub-pulse 534 has a duty cycle of about 20% to about 80%, the vertical etching rate 400 may be greater than the horizontal etching rate 500. When the vertical etching rate 400 is greater than the horizontal etching rate 500, the channel hole 200 may have an increased aspect ratio without bowing defects. When the sub-pulse 534 has a duty cycle of about 50%, the vertical etching rate 400 may increase to maximum, and the horizontal etching rate 500 may decrease to minimum. When the vertical etching rate 400 increases to maximum, and when the horizontal etching rate 500 decreases to minimum, the channel hole 200 may have a maximum aspect ratio.

Referring back to FIGS. 1 and 17, the second RF matcher 74 may match the impedance of the first bias power 53 with the impedance of the plasma 42 (S224). When the impedance of the first bias power 53 matches the impedance of the plasma 42, the reflected power 68 may be removed.

The third power supply 56 may provide the electrostatic chuck 40 with the second bias power 55 to accelerate the plasma 42 toward the substrate W (S225). The etching rate of the substrate W may increase in proportion to the second bias power 55. In an implementation, the second bias power 55 may be about 20 KW to 30 KW. The second bias power 55 may have the second single pulse 550. The second single pulse 550 may be an envelope of the third frequency 55a. The second single pulse 550 may have the same pulse frequency as that of the first single pulse 510 and that of the main pulse 532. The second single pulse 550 may have a pulse frequency of about 1 KHz.

The third RF matcher 76 may match the impedance of the second bias power 55 with the impedance of the plasma 42 (S226). When the impedance of the second bias power 55 matches the impedance of the plasma 42, the reflected power 68 may be removed.

Figure 9:
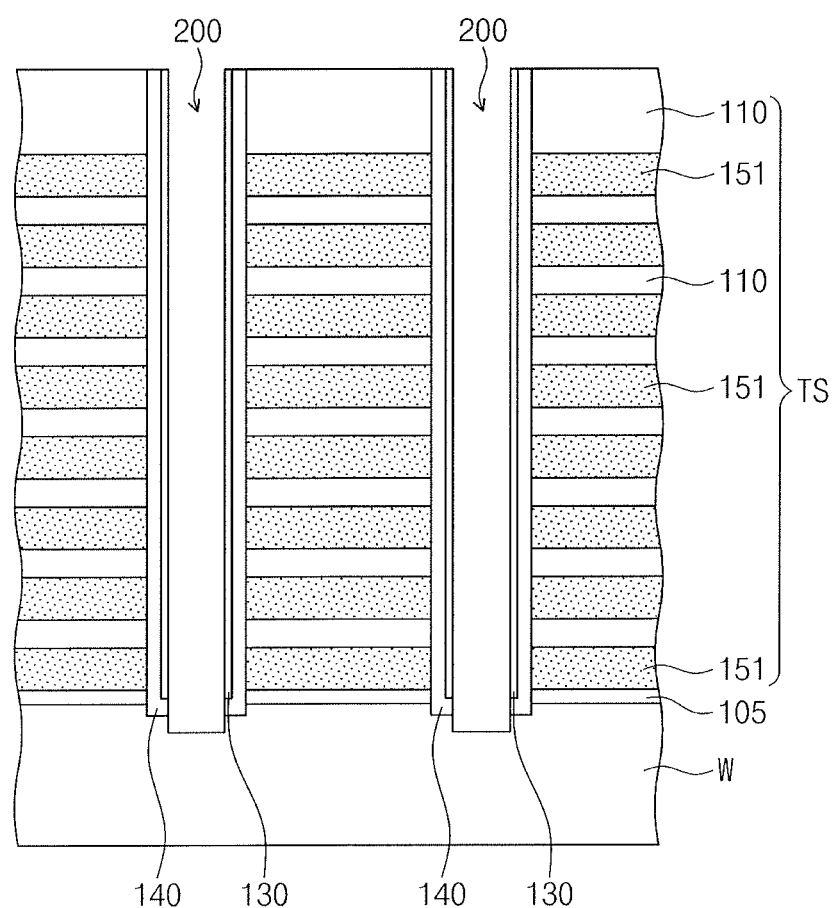

Referring to FIGS. 6 and 9, a film deposition apparatus may form a vertical insulator 140 and a first semiconductor pattern 130 on an inner wall of the channel hole 200 (S30). In an implementation, a vertical dielectric layer and a first semiconductor layer may be conformally formed on the inner walls of the channel holes 200 and on the substrate W. The vertical dielectric layer and the first semiconductor layer may be deposited by plasma enhanced chemical vapor deposition (CVD), physical vapor deposition (PVD), or atomic layer deposition (ALD).

The vertical dielectric layer may include a charge storage layer that is used as a memory element of a flash memory device. In an implementation, the charge storage layer may be a trap dielectric layer or a dielectric layer that includes conductive nano-dots. In an implementation, the vertical dielectric layer may include a thin film for a phase change memory device or for a variable resistance memory device. In an implementation, the vertical dielectric layer may include a blocking dielectric layer, a charge storage layer, or a tunnel dielectric layer. The blocking dielectric layer may cover sidewalls of the sacrificial layers 151, sidewalls of the upper dielectric layers 110, and the top surface of the substrate W, which sidewalls and top surface are exposed to the channel holes 200. The blocking dielectric layer may include, e.g., silicon oxide. The charge storage layer may include a trap dielectric layer or a dielectric layer that includes conductive nano-dots. In an implementation, the charge storage layer may include silicon nitride, silicon oxynitride, silicon-rich nitride, nano-crystalline silicon, or a laminated trap layer. The tunnel dielectric layer may include a material having a bandgap greater than that of the charge storage layer. In an implementation, the tunnel dielectric layer may be silicon oxide.

The first semiconductor layer may be formed on the vertical dielectric layer. In an implementation, the first semiconductor layer may be polycrystalline silicon, single-crystalline silicon, or amorphous silicon.

After the vertical dielectric layer and the first semiconductor layer are sequentially formed, the first semiconductor layer and the vertical dielectric layer may be anisotropically etched to partially expose the substrate W. Accordingly, the first semiconductor pattern 130 and the vertical insulator 140 may be formed on the inner wall of the channel hole 200. The vertical insulator 140 and the first semiconductor pattern 130 may each have a cylindrical shape whose opposite ends are opened. While the first semiconductor layer and the vertical dielectric layer are anisotropically etched, the top surface of the substrate W may be recessed due to over-etching.

In an implementation, the anisotropic etching of the first semiconductor layer and the vertical dielectric layer may expose a top surface of the mold dielectric layer TS. Therefore, the vertical insulator 140 and the first semiconductor pattern 130 may be formed locally in the channel hole 200.

Figure 10:
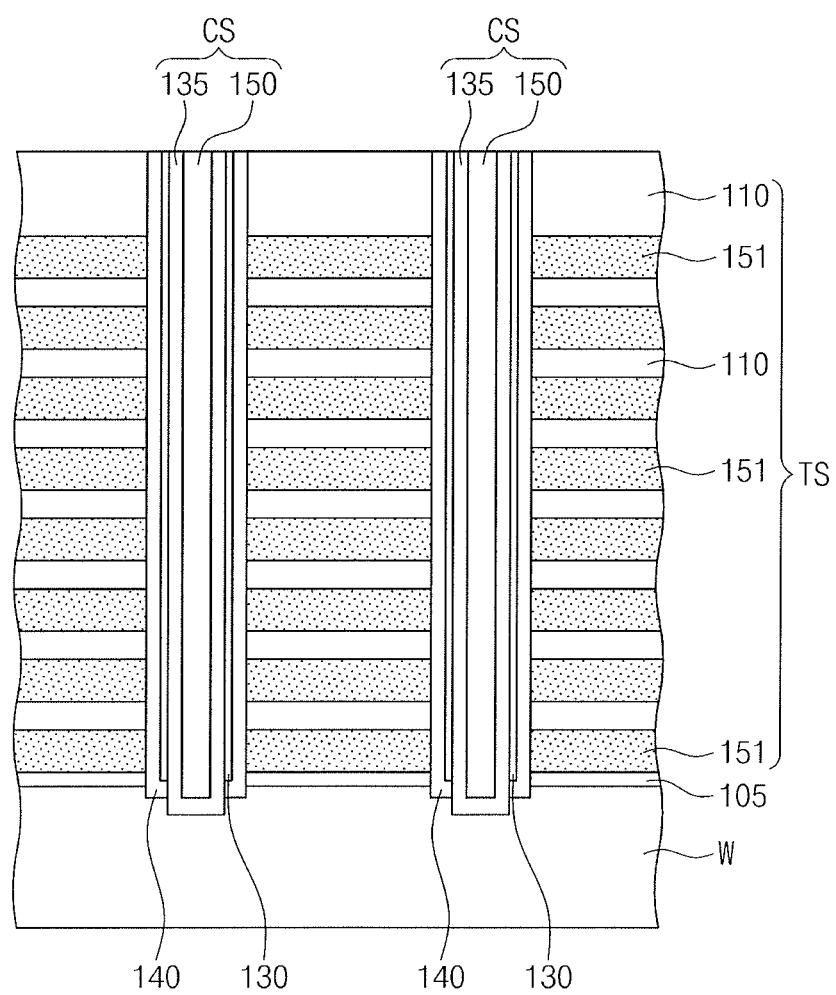

Referring to FIGS. 6 and 10, a film deposition apparatus may form channel structures CS on the vertical insulators 140, the first semiconductor patterns 130, and the substrate W in the channel holes 200 (S40). Each of the channel structures CS may include a second semiconductor pattern 135 and a vertical dielectric pattern 150. In an implementation, the second semiconductor pattern 135 and the vertical dielectric pattern 150 may be formed by depositing a second semiconductor layer and a dielectric layer, and then planarizing the second semiconductor layer and the dielectric layer. In an implementation, the second semiconductor layer and the dielectric layer may be sequentially formed on the substrate W. The second semiconductor layer may be conformally formed to have a thickness so as not to completely fill the channel holes 200. The second semiconductor layer may include a semiconductor material (e.g., polycrystalline silicon, single-crystalline silicon, or amorphous silicon) formed using atomic layer deposition (ALD) or chemical vapor deposition (CVD). The dielectric layer may be formed to completely fill the channel holes 200. The dielectric layer may be one of silicon oxide and a dielectric material that are formed using spin-on-glass (SOG) technology. Subsequently, the second semiconductor layer and the dielectric layer may be planarized to expose the top surface of the mold dielectric layer IS, and thus the second semiconductor patterns 135 and the vertical dielectric patterns 150 may be formed locally in the channel holes 200.

The channel holes 200 may be provided therein with the second semiconductor patterns 135 (each formed to have a cup shape, a pipe shape whose one end is closed, or a hollow cylindrical shape whose one end is closed). In an implementation, the second semiconductor patterns 135 may be formed to each have a pillar shape that fills the channel hole 200.

The vertical dielectric patterns 150 may be formed to fill the channel holes 200.

Figure 11:
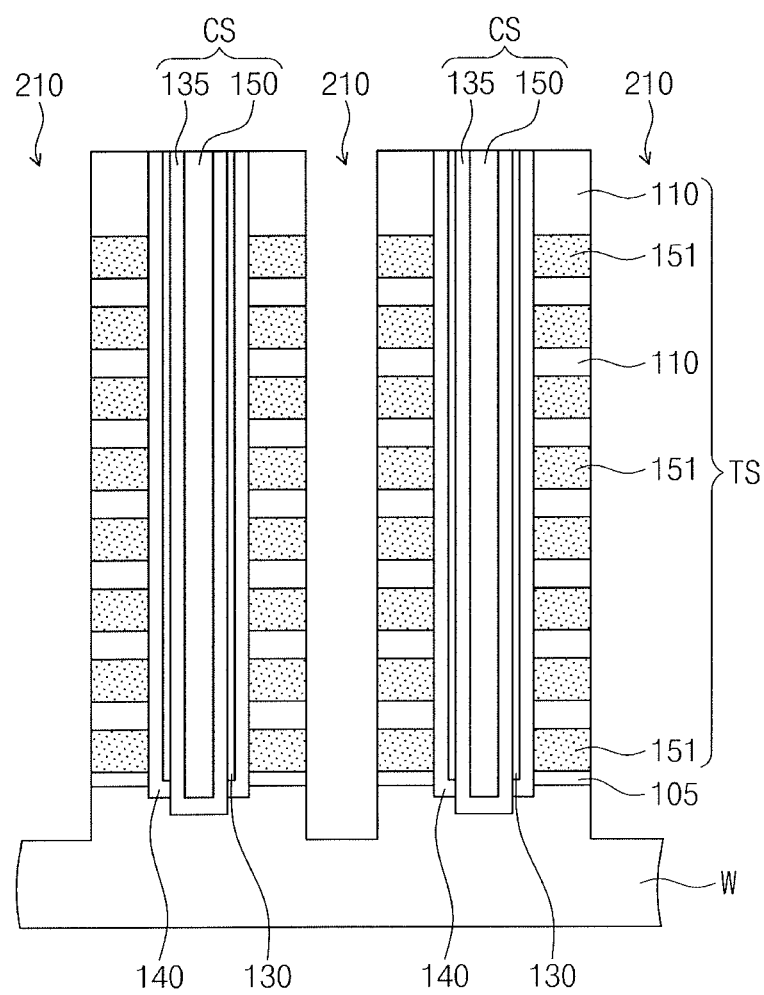

Referring to FIGS. 6 and 11, an etching apparatus may partially remove the mold dielectric layer TS between the channel holes 200, thereby forming trenches 210 (S50). The trenches 210 may partially expose the substrate W.

Figure 12:
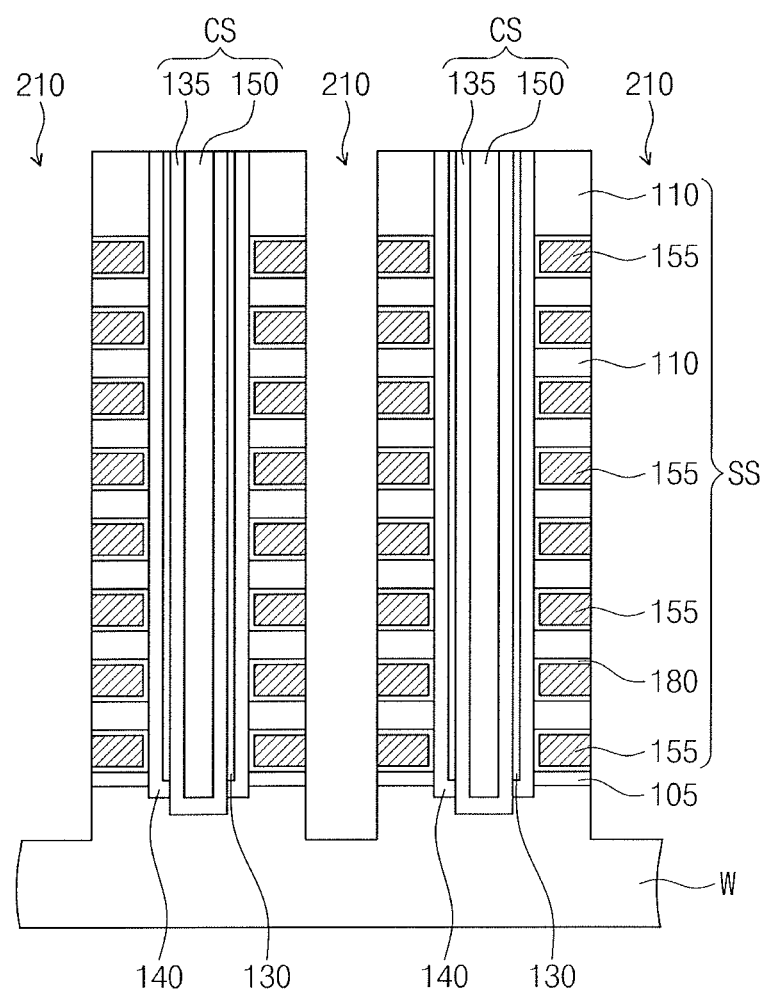

Referring to FIGS. 6 and 12, an etching apparatus may form recesses by removing the sacrificial layers 151 exposed to the trenches 210, and a film deposition apparatus may form horizontal insulators 180 and gate electrodes 155 in the recesses (S60). The recesses may be gaps that horizontally extend from the trenches 210, and may be formed to partially expose sidewalls of the vertical insulators 140 and sidewalls of the upper dielectric layers 110. The horizontal insulators 180 may be formed to cover inner walls of the recesses.

The gate electrodes 155 may be formed to fill remaining portions of the recesses in which the horizontal insulators 180 have been formed. The formation of the horizontal insulators 180 and the gate electrodes 155 may include sequentially forming a horizontal layer and a gate layer (e.g., a metal layer) that sequentially fill the recesses, and then removing the horizontal layer and the gate layer from the trenches 210. The horizontal insulators 180 may each include a data storage layer. Similar to the vertical insulators 140, the horizontal insulators 180 may each include a single thin layer or a plurality of thin layers. In an implementation, each of the horizontal insulators 180 may include a blocking dielectric layer of a charge-trap type nonvolatile memory transistor.

A stack structure SS may formed, and may include the gate electrodes 155 and the upper dielectric layers 110 that are sequentially stacked.

Figure 13:
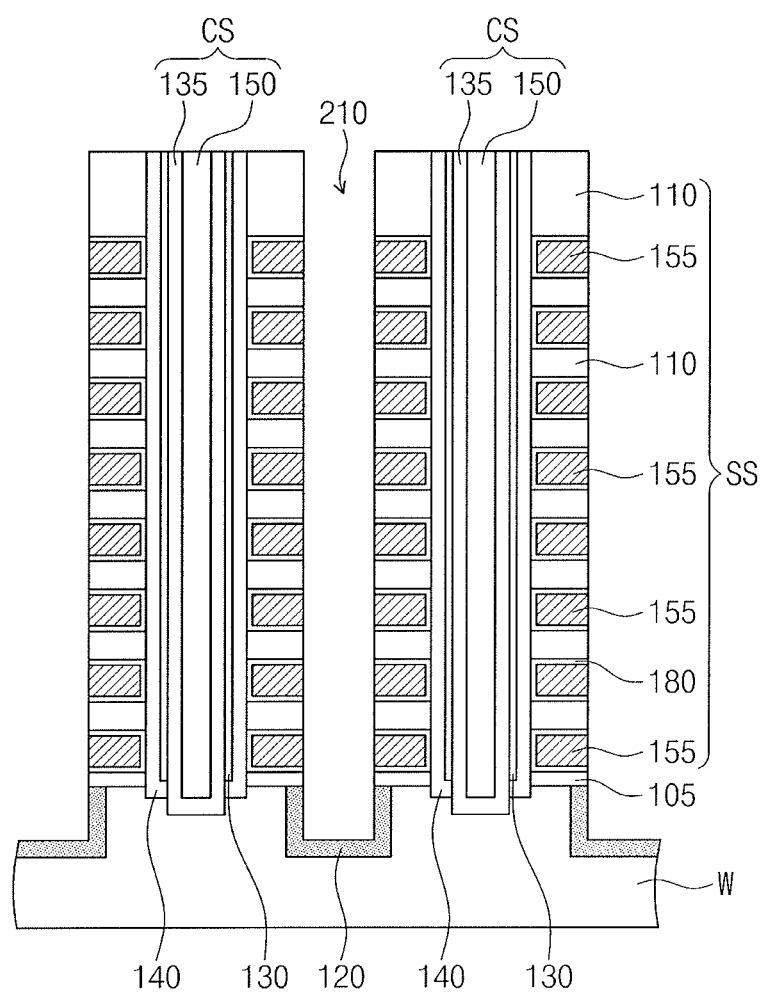

Referring to FIGS. 6 and 13, a diffusion apparatus or an ion implantation apparatus may be used to form common source regions 120 in the substrate W in the trenches 210 (S70). An ion implantation process may form the common source regions 120 in portions of the substrate W that are exposed to the trenches 210. The common source regions 120 and the substrate W may constitute PN junctions. In an implementation, the common source regions 120 may be connected to each other to have the same electrical potential state. In an implementation, the common source regions 120 may be electrically separated to have electrical potentials different from each other. In an implementation, the common source regions 120 may constitute a plurality of source groups electrically independent of each other, each source group including corresponding ones of the common source regions 120, such that the plurality of source groups may be electrically separated to have electrical potentials different from each other.

Figure 14:
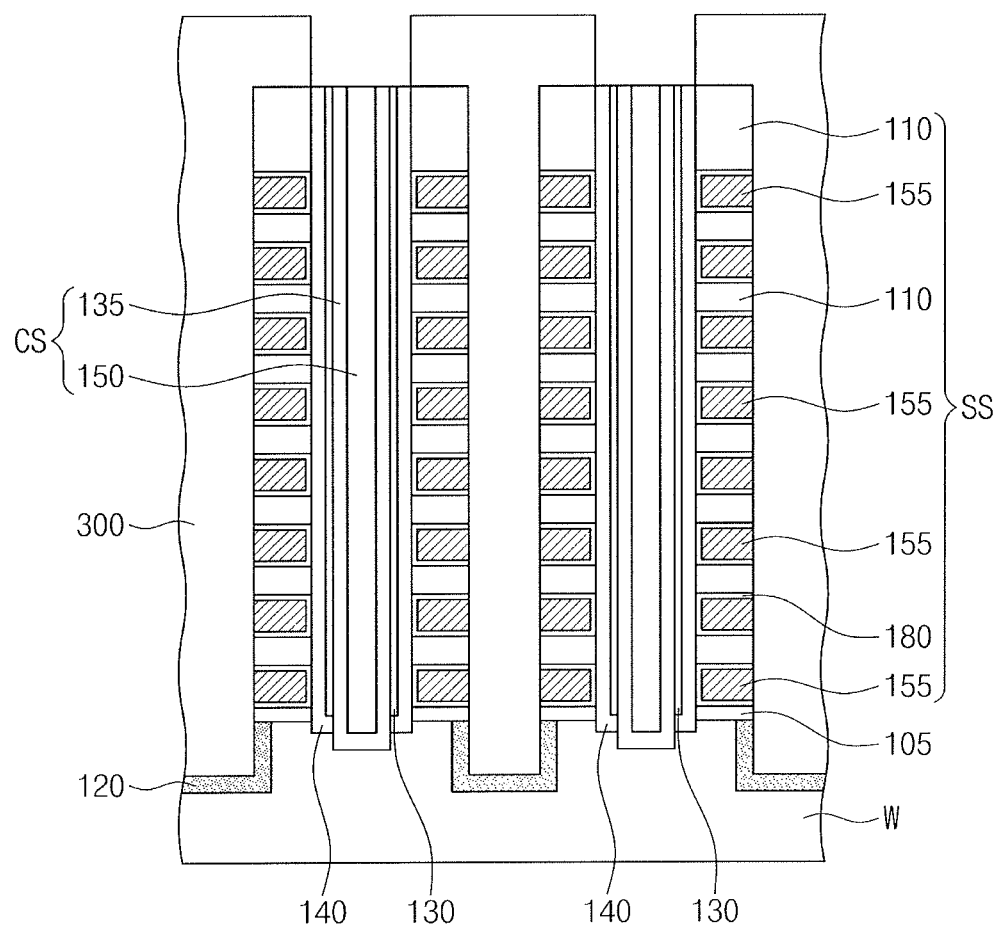

Referring to FIGS. 6 and 14, a film deposition apparatus and an etching apparatus may form electrode isolation patterns 300 in the trenches 210 on the common source regions 120 (S80). The electrode isolation patterns 300 may be formed of silicon oxide, silicon nitride, or silicon oxynitride. In an implementation, the electrode isolations patterns 300 may be patterned by a photolithography process or an etching process. The channel structures CS may be exposed by the electrode isolation patterns 300.

Figure 15:
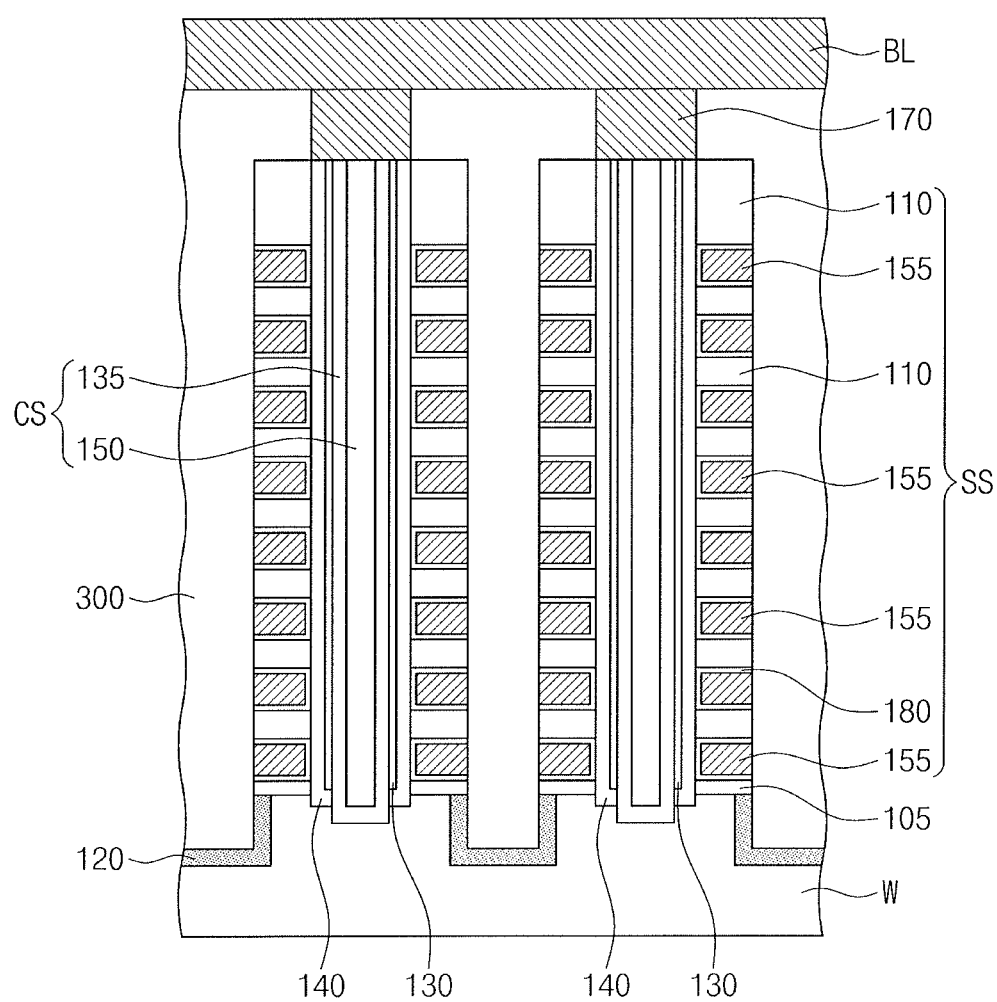

Referring to FIGS. 6 and 15, a film deposition apparatus and an etching apparatus may form contact plugs 170 and a bit line BL on the first semiconductor patterns 130 and the channel structures CS (S90). The contact plug 170 may be connected to the first semiconductor pattern 130 and the channel structure CS. In an implementation, the contact plug 170 may be formed by recessing upper portions of the first semiconductor pattern 130 and the channel structures CS, and then filling the resulting recesses with a conductive material.

The bit line BL may be formed on the contact plugs 170 and the electrode isolation patterns 300. The bit line BL may be electrically connected through the contact plug 170 to the first and second semiconductor patterns 130 and 135.

FIGS. 23 to 26 show examples of the source power 51, the first bias power 53, and the second bias power 55 of the apparatus of FIG. 1.

Referring to FIGS. 1 and 23 to 26, the source power 51, the first bias power 53, and the second bias power 55 may respectively include a first pulse 518, a second pulse 538, and a third pulse 558.

The first pulse 518 of the source power 51 may be an envelope of the first frequency 51*a*. In an implementation, the first pulse 518 may have a pulse frequency of about 1 KHz. The first frequency 51*a* may be about 60 MHz. The first pulse 518 may have a duty cycle of about 50%. The first pulse 518 may be a two-level pulse. In an implementation, the first pulse 518 may have a high-level duration 514 and a low-level duration 516. The high-level duration 514 and the low-level duration 516 may be arranged alternately and repeatedly along a time axis. The high-level duration 514 may have a power greater than that of the low-level duration 516. When the first pulse 518 is a two-level pulse, the high-level duration 514 may be a first flat duration or a high flat duration. The low-level duration 516 may be a low flat duration. When the first pulse 518 is a single level pulse, the high-level duration 514 may be a first pulse-on duration, and the low-level duration 516 may be a first off-duration.

The second pulse 538 of the first bias power 53 may be synchronized with the first pulse 518. The second pulse 538 may be an envelope of the second frequency 53*a*. In an implementation, the second pulse 538 may have a pulse frequency of about 1 KHz. The second frequency 53*a* may be about 2 MHz. The second pulse 538 may have a duty cycle of about 50%. The second pulse 538 may be a single level pulse. The second pulse 538 may have a second pulse-on duration 537 and a second pulse-off duration 539. The second pulse-on duration 537 may be a section with which the second pulse 538 is substantially provided. The second pulse-on duration 537 may have a power greater than that of the second pulse-off duration 539. The second pulse-off duration 539 may be a section without the second pulse 538.

The third pulse 558 of the second bias power 55 may be synchronized with the first pulse 518 and the second pulse 538. The third pulse 558 may be an envelope of the third frequency 55*a*. In an implementation, the third pulse 558 may have a pulse frequency of about 1 KHz. The third frequency 55*a* may be about 400 KHz. The third pulse 558 may have a duty cycle of about 50%. The third pulse 558 may be a single level pulse. The third pulse 558 may have a third pulse-on duration 557 and a third pulse-off duration 559. The third pulse-on duration 557 may have a power greater than that of the third pulse-off duration 559.

One or more of the high-level duration 514, the second pulse-on duration 537, and the third pulse-on duration 557 may have a pulse inclination 82. The pulse inclination 82 may help stabilize the ion energy of the plasma 42. The pulse inclination 82 may be obtained by pulse inclination modulation. The pulse inclination 82 may be an upward inclination. The pulse inclination 82 may be the same for the first pulse 518, the second pulse 538, and the third pulse 558.

The following will discuss in detail the first, second, and third pulses 518, 538, and 558 at least one of which has the pulse inclination 82.

Figure 23:
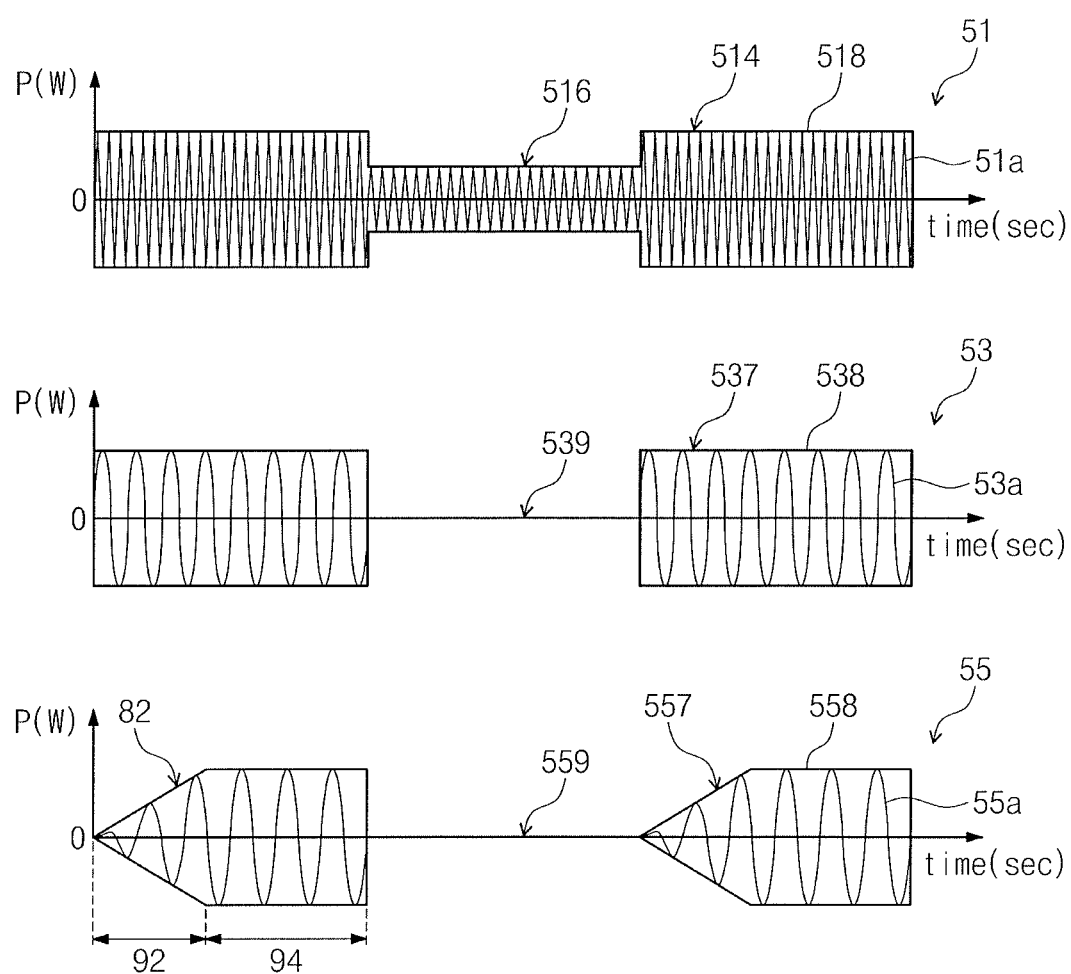
FIGS. 23 to 26 illustrate graphs of examples of a source power, a first bias power, and a second bias power for the plasma etching apparatus of FIG. 1.

Referring to FIG. 23, the third pulse 558 may selectively have the pulse inclination 82. The third pulse-on duration 557 of the third pulse 558 may include a third inclined duration 92 and a third flat duration 94. The third inclined duration 92 may be a section having the pulse inclination 82. The third inclined duration 92 may be followed by the third flat duration 94. The third flat duration 94 may be arranged immediately after the third inclined duration 92. The third inclined duration 92 may be an upwardly inclined section. The third inclined duration 92 may have a power less than that of the third flat duration 94 and greater than half that of the third flat duration 94.

Figure 24:
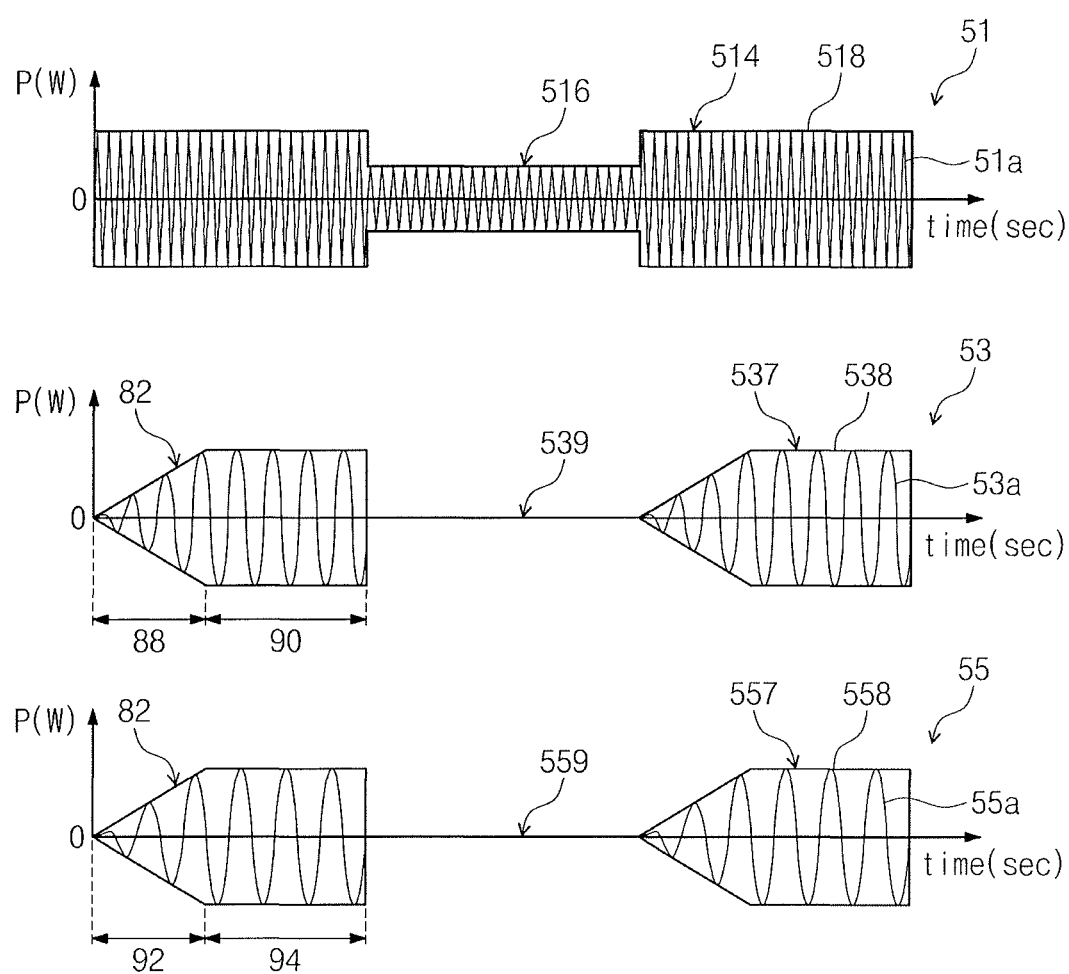

Referring to FIG. 24, each of the second and third pulses 538 and 558 may have the pulse inclination 82. The second pulse-on duration 537 may have a second inclined duration 88 and a second flat duration 90. The second inclined duration 88 may be a section having the pulse inclination 82. The second inclined duration 88 may be followed by the second flat duration 90. The second flat duration 90 may be arranged immediately after the second inclined duration 88. The second inclined duration 88 may be synchronized with the third inclined duration 92, and the second flat duration 90 may be synchronized with the third flat duration 94. The second inclined duration 88 may have a power less than that of the second flat duration 90 and greater than half that of the second flat duration 90. The third inclined duration 92 and the third flat duration 94 may be configured identically to that discussed in FIG. 23.

Figure 25:
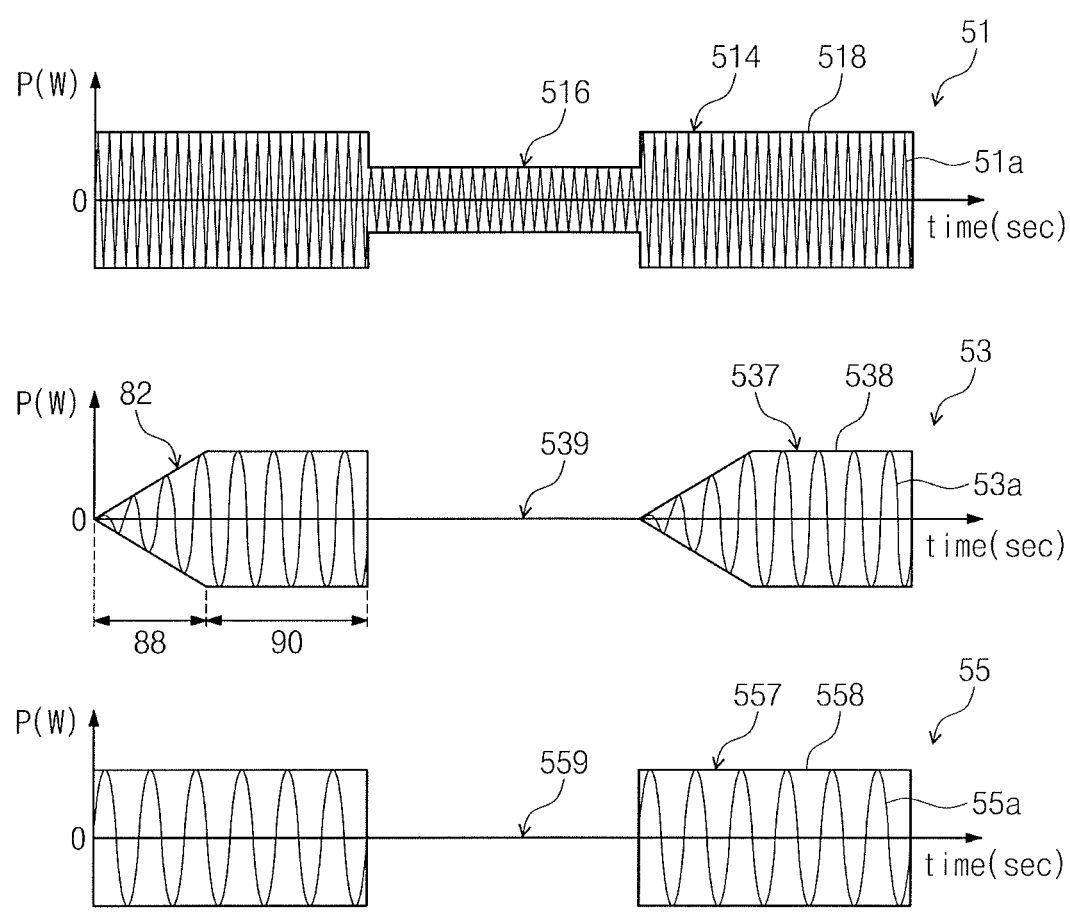

Referring to FIG. 25, the second pulse 538 may selectively have the pulse inclination 82. The pulse inclination 82 may create the second inclined duration 88. The second inclined duration 88 and the second flat duration 90 may be configured identically to that discussed in FIG. 24.

Figure 26:
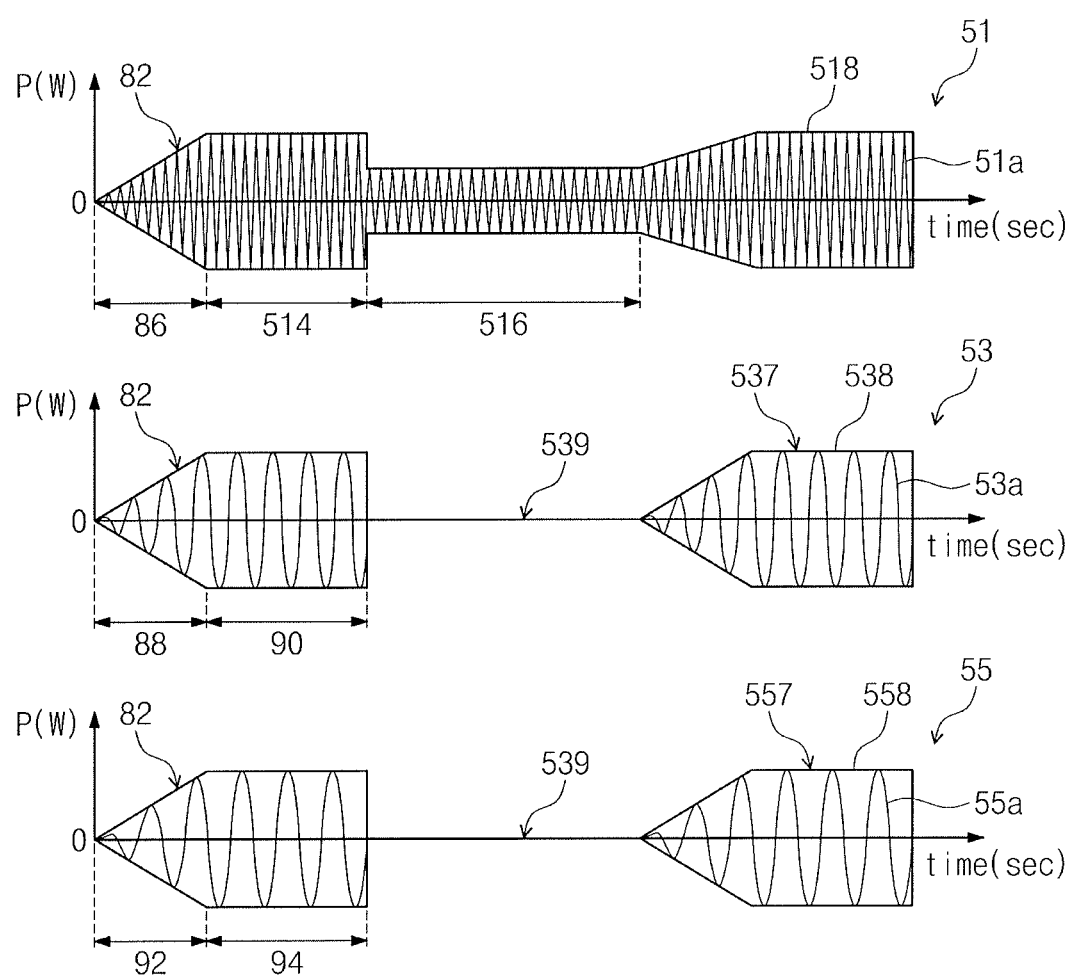

Referring to FIG. 26, the first, second, and third pulses 518, 538, and 558 may all have the pulse inclination 82. The first pulse 518 may be the two-level pulse 512 of FIG. 4. In an implementation, the first pulse 518 may include a first inclined duration 86, between the low-level duration 516 and the high-level duration 514. The first inclined duration 86 may be a section having the pulse inclination 82. The first inclined duration 86 may have a power less than that of the high-level duration 514 and greater than half that of the high-level duration 514. The first inclined duration 86 may be followed by the high-level duration 514. The high-level duration 514 may be arranged immediately after the first inclined duration 86. The first inclined duration 86 may be synchronized with the second inclined duration 88 and the third inclined duration 92, and the high-level duration 514 may be synchronized with the second flat duration 90 and the third flat duration 94. The second inclined duration 88, the second flat duration 90, the third inclined duration 92, and the third flat duration 94 may be configured identically to those discussed in FIGS. 23 to 25.

In an implementation, the second and third pulses 538 and 558 may not have their respective second and third inclined durations 88 and 92, and the first pulse 518 may selectively and/or independently have the first inclined duration 86.

FIGS. 27 to 30 show examples of the source power 51, the first bias power 53, and the second bias power 55 of the apparatus of FIG. 1.

Referring to FIGS. 27 to 30, at least one of the pulse inclinations 82 of the first, second, and third pulses 518, 538, and 558 may include an upward inclination 81 and a downward inclination 83. The upward inclination 81 may be created ahead of the high-level duration 514, the second flat duration 90, or the third flat duration 94. The downward inclination 83 may be created behind or after the high-level duration 514, the second flat duration 90, or the third flat duration 94.

Figure 27:
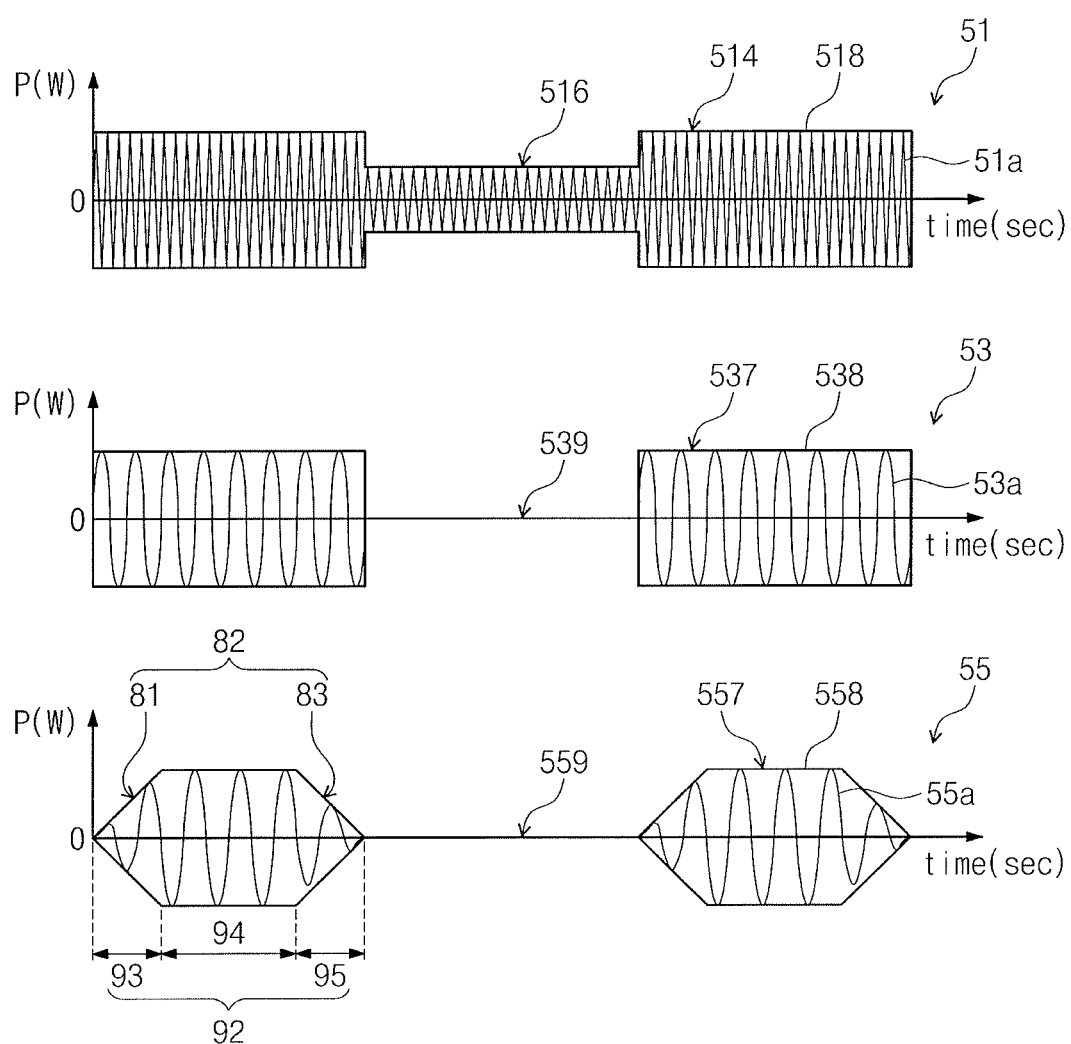
FIGS. 27 to 30 illustrate graphs showing examples of a source power, a first bias power, and a second bias power for the plasma etching apparatus of FIG. 1.

Referring to FIG. 27, the third pulse-on duration 557 of the third pulse 558 may include a third inclined duration 92 caused by the upward inclination 81 and the downward inclination 83. The third inclined duration 92 may include a third upward duration 93 and a third downward duration 95. The third upward duration 93 may be created due to the upward inclination 81, and the third downward duration 95 may be created due to the downward inclination 83. The third upward duration 93 may have the same time period as that of the third downward duration 95. The third upward duration 93 and the third downward duration 95 may help stabilize an ionization energy of the plasma 42. The third upward duration 93 and the third downward duration 95 may be arranged respectively ahead of and behind the third flat duration 94.

Figure 28:
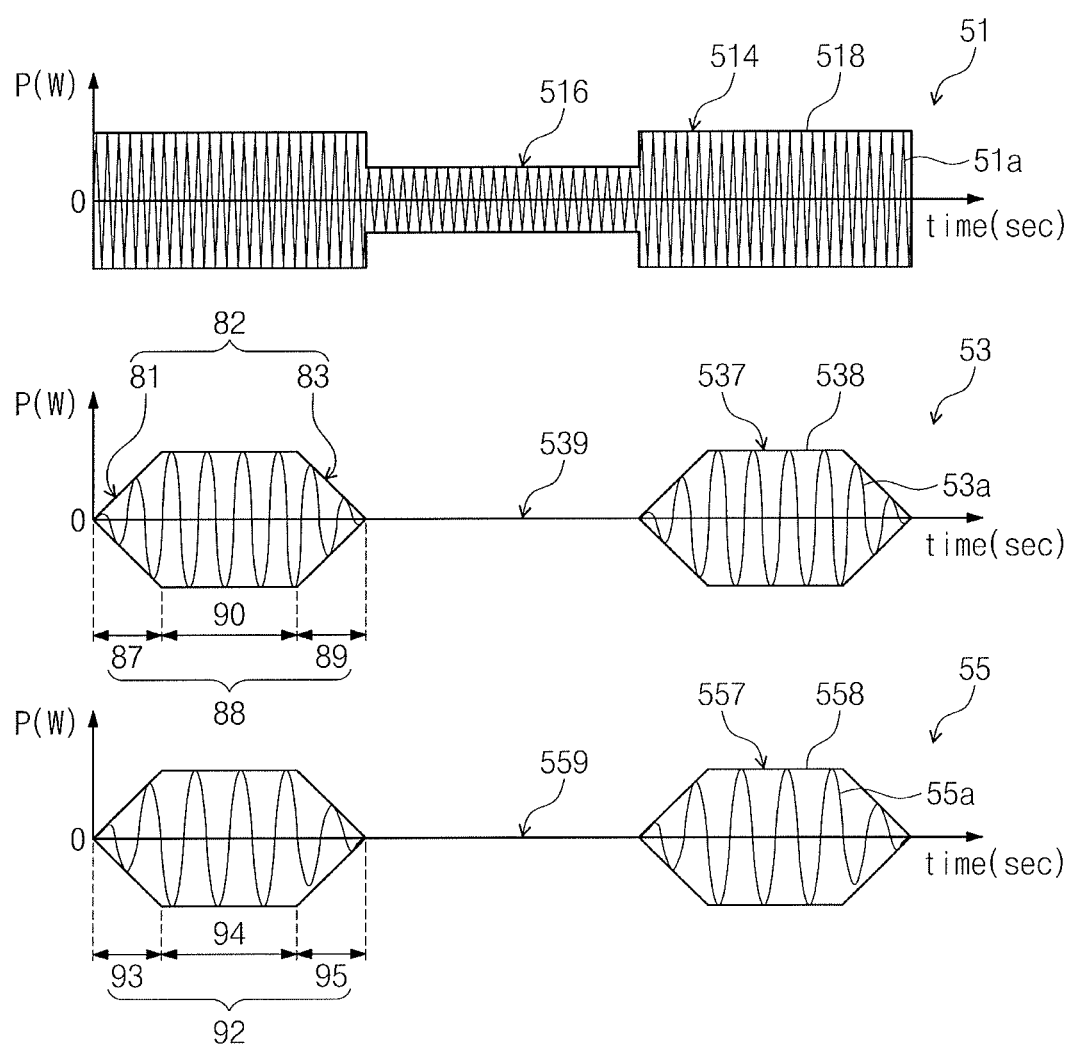

Referring to FIG. 28, the second pulse-on duration 537 of the second pulse 538 may have a second inclined duration 88 caused by the upward inclination 81 and the downward inclination 83, and likewise the third pulse-on duration 557 of the third pulse 558 may have a third inclined duration 92 caused by the upward inclination 81 and the downward inclination 83. The second inclined duration 88 may include a second upward duration 87 and a second downward duration 89. The second upward duration 87 may be created due to the upward inclination 81, and the second downward duration 89 may be created due to the downward inclination 83. The second upward duration 87 may have the same time period as that of the second downward duration 89. The second upward duration 87 and the second downward duration 89 may help stabilize the ionization energy of the plasma 42. The second upward duration 87 and the second downward duration 89 may be arranged respectively ahead of and behind the second flat duration 90. The third upward duration 93 and the third downward duration 95 may be configured identically to that discussed in FIG. 27.

Figure 29:
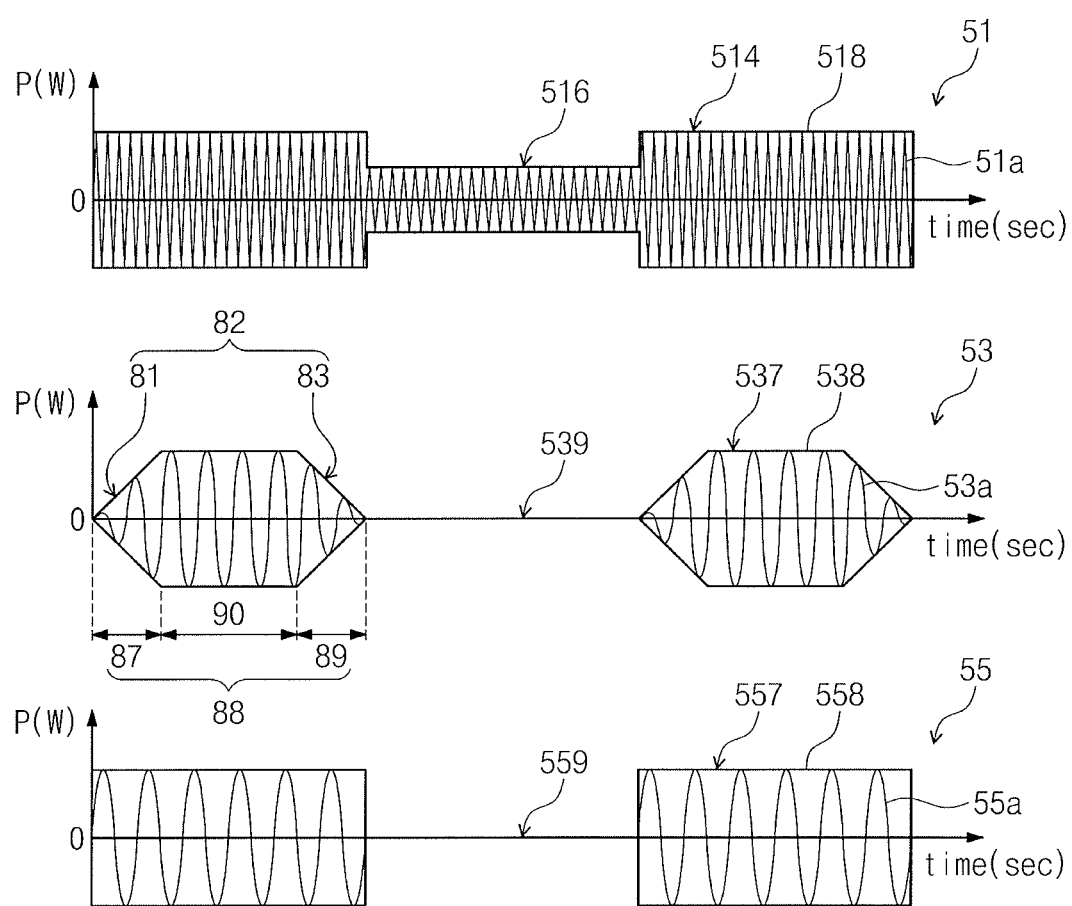

Referring to FIG. 29, the second pulse-on duration 537 of the second pulse 538 may selectively have a second upward duration 87 and a second downward duration 89 of the second inclined duration 88. The second upward duration 87 and the second downward duration 89 may be configured identically to that discussed in FIG. 28.

Figure 30:
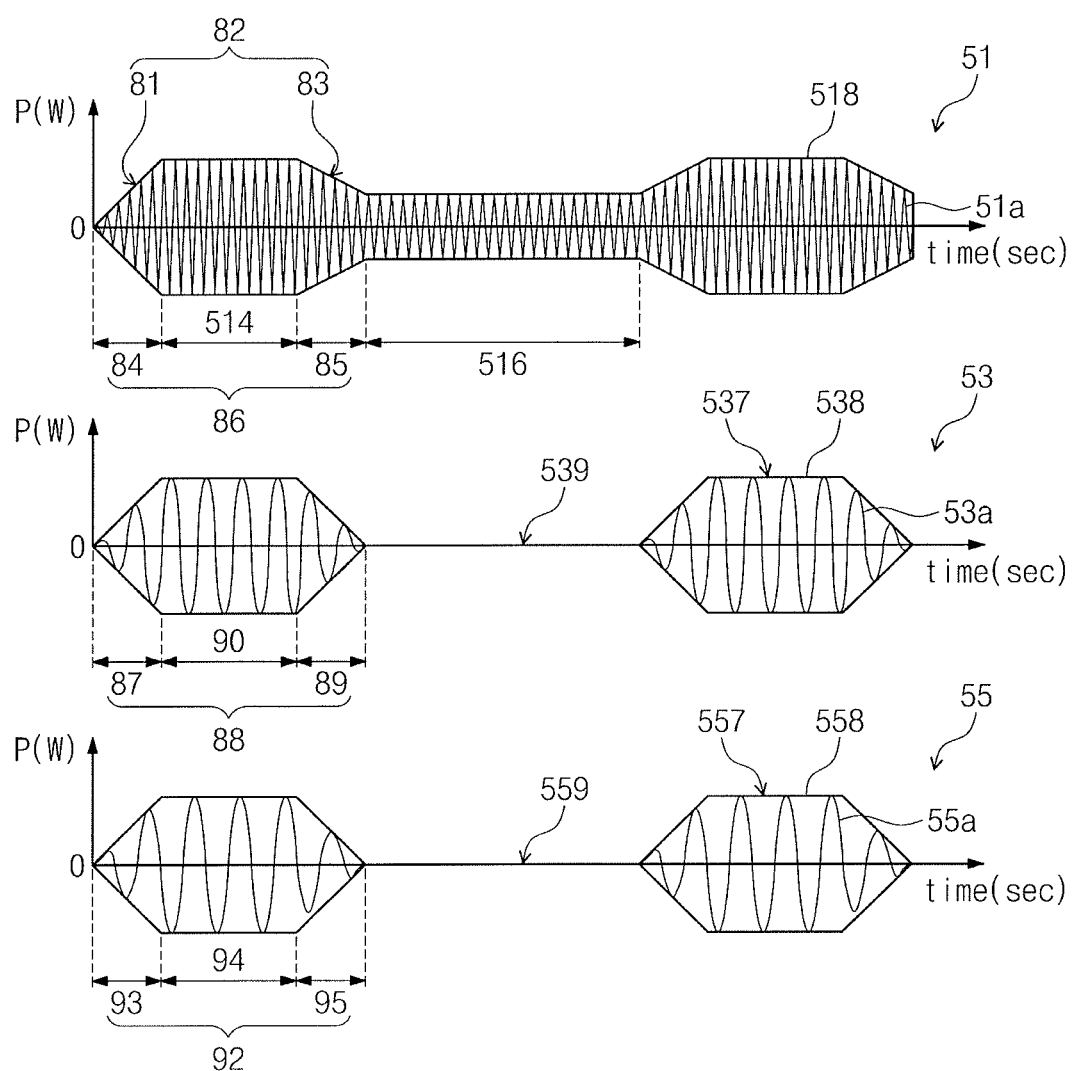

Referring to FIG. 30, the first, second, and third pulses 518, 538, and 558 may all have the pulse inclination 82. For example, the first pulse 518 may have a first inclined duration 86 between the high-level duration 514 and the low-level duration 516, and the first inclined duration 86 may include a first upward duration 84 and a first downward duration 85. The first upward duration 84 and the first downward duration 85 may be created respectively due to the upward inclination 81 and the downward inclination 83. The first upward duration 84 and the first downward duration 85 may be arranged respectively ahead of and behind the high-level duration 514. The first upward duration 84 may have the same time period as that of the first downward duration 85. The first upward duration 84 and the first downward duration 85 may help stabilize the ionization energy of the plasma 42. The second upward duration 87 and the second downward duration 89 of the second pulse 538 may be configured identically to that discussed in FIGS. 28 and 29, and the third upward duration 93 and the third downward duration 95 of the third pulse 558 may be configured identically to that discussed in FIGS. 27 and 28.

In an implementation, the second and third pulses 538 and 558 may not have their respective second and third inclined durations 88 and 92, and the first pulse 518 may selectively and/or independently have the first inclined duration 86.

Figure 31:
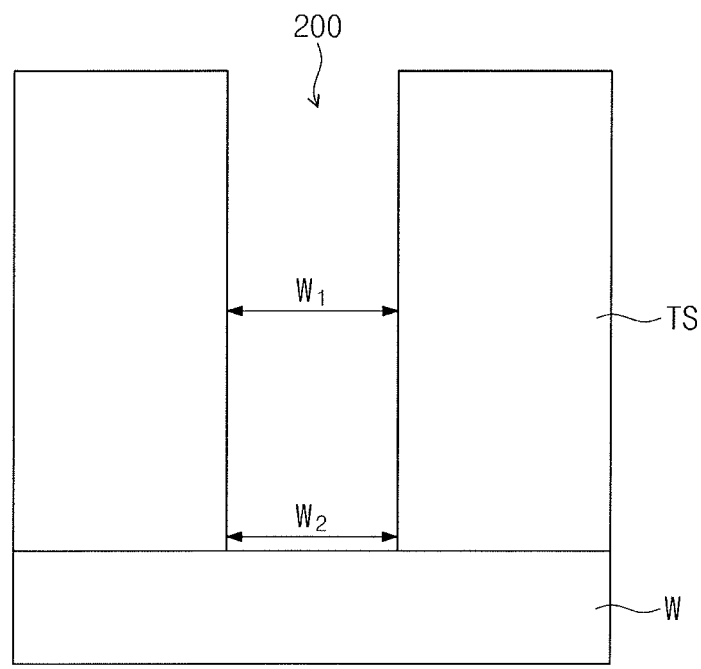
FIG. 31 illustrates a cross-sectional view showing a channel hole formed by a radio frequency power having a first pulse, a second pulse, and a third pulse depicted in FIG. 30.

FIG. 31 shows the channel hole 200 that is formed by the RF power 58 having the first pulse 518, the second pulse 538, and the third pulse 558 that are depicted in FIG. 30.

Referring to FIGS. 16 and 31, the plasma etching apparatus 100 may use the RF power 58 having the first, second, and third pulses 518, 538, and 558 to etch the mold dielectric layer TS to form the channel hole 200 (S220). The channel hole 200 may have a bow width W1 and a bottom width W2 depending on a depth of the channel hole 200. The bow width W1 may be a width at an intermediate depth of the channel hole 200. The bottom width W2 may be a width at a bottom end of the channel hole 200. In an implementation, the bow width W1 and the bottom width W2 may be adjusted by a ratio of the first, second, and third inclined durations 86, 88, and 92 to the second and third flat durations 90 and 94 and the high-level duration 514 of the first, second, and third pulses 518, 538, and 558.

Figure 32:
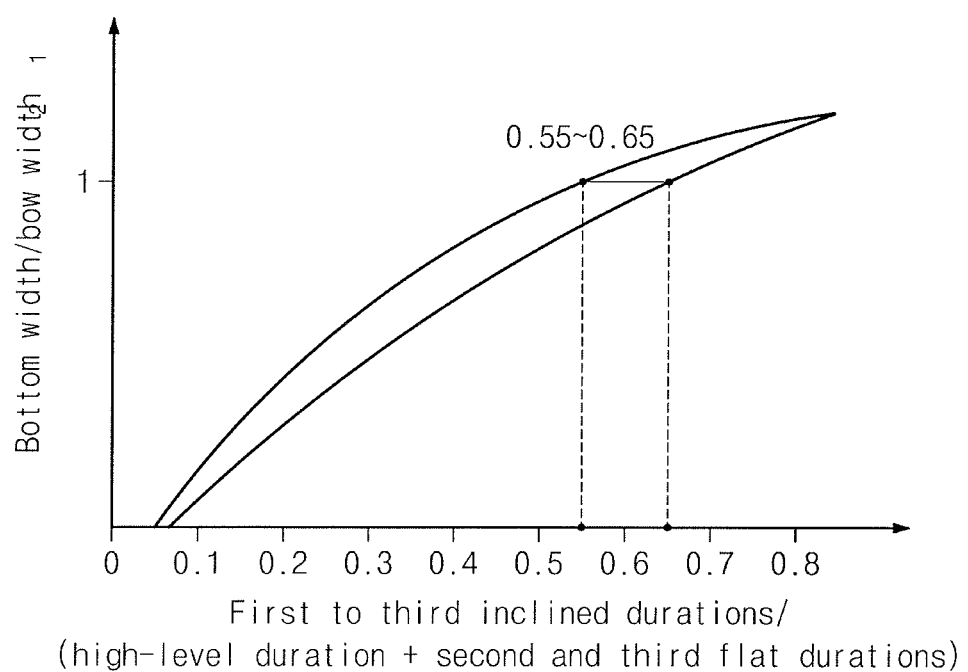
FIG. 32 illustrates a graph showing a ratio of a bottom width to a bow width changes with a ratio of first, second, and third inclined durations to a high-level duration and second and third flat durations.

FIG. 32 shows how a ratio of the bottom width W2 to the bow width W1 changes with the ratio of the first, second, and third inclined durations 86, 88, and 92 to the high-level duration 514 and the second and third flat durations 90 and 94.

Referring to FIGS. 30 and 32, when a value of about 0.55 to about 0.65 is given to the ratio of the first, second, and third inclined durations 86, 88, and 92 to the high-level duration 514 and the second and third flat durations 90 and 94, the ratio of the bottom width W2 to the bow width W1 may be about 1. In this case, the bow width W1 may be the same as the bottom width W2, and the channel hole 200 may have an increased or maximum aspect ratio.

In FIG. 23, when a ratio of the third inclined duration 92 to the third flat duration 94 (e.g., a ratio of a length of time of the inclined durations) is about 0.55 to about 0.65, the aspect ratio of the channel hole 200 may increase to maximum. In FIG. 24, a ratio of the second and third inclined durations 88 and 92 to the second and third flat durations 90 and 94 may range from about 0.55 to about 0.65. In FIG. 25, a ratio of the second inclined duration 88 to the second flat duration 90 may range from about 0.55 to 0.65. In FIG. 26, a ratio of the first, second, and third inclined durations 86, 88, and 92 to the high-level duration 514 and the second and third flat durations 90 and 94 may range from about 0.55 to about 0.65. In FIG. 27, a ratio of the third upward and downward durations 93 and 95 to the third flat duration 94 may range from about 0.55 to about 0.65. In FIG. 28, a ratio of the second upward and downward durations 87 and 89 and the third upward and downward durations 93 and 95 to the second and third flat durations 90 and 94 may range from about 0.55 to about 0.65. In FIG. 29, a ratio of the second upward and downward durations 87 and 89 to the second flat duration 90 may range from about 0.55 to about 0.65. In FIG. 30, a ratio of the first, second, and third upward and downward durations 84, 85, 87, 89, 93, and 95 to the high-level duration 514 and the second and third flat durations 90 and 94 may range from about 0.55 to about 0.65.

If the ratio of the first, second, and third inclined durations 86, 88, and 92 to the high-level duration 514 and the second and third flat durations 90 and 94 were to be less than about 0.55, the bow width W1 could be greater than the bottom width W2, and the mold dielectric layer TS could increase in etching failure. If the ratio of the first, second, and third inclined durations 86, 88, and 92 to the high-level duration 514 and the second and third flat durations 90 and 94 were to be greater than about 0.65, the bow width W1 could be less than the bottom width W2, and the mold dielectric layer TS could increase in etching failure.

As discussed above, the plasma etching method according to an embodiment may use a bias power having burst pulses to increase an etching rate of a mold dielectric layer without upper clogging of channel holes.

One or more embodiments may provide a semiconductor device fabrication method using a plasma etching apparatus.

One or more embodiments may provide a plasma etching method that may increase an etching rate of a mold dielectric layer without upper clogging of a channel hole.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A plasma etching method, comprising:
providing a source power having a first single pulse to an electrostatic chuck in order to generate a plasma on a substrate;
providing a first bias power having a burst pulse different from the first single pulse to concentrate the plasma on the substrate; and
providing a second bias power having a second single pulse the same as the first single pulse to accelerate the plasma toward the substrate.

2. The plasma etching method as claimed in claim 1, wherein the burst pulse includes:
a main pulse; and
a sub-pulse that has a pulse frequency less than a pulse frequency of the main pulse.

3. The plasma etching method as claimed in claim 2, wherein
the pulse frequency of the main pulse is about 1 KHz, and
the pulse frequency of the sub-pulse is about 100 Hz.

4. The plasma etching method as claimed in claim 2, wherein a duty cycle of the sub-pulse is about 20% to about 80%.

5. The plasma etching method as claimed in claim 2, wherein each of the first single pulse and the second single pulse has the same pulse frequency as the pulse frequency of the main pulse.

6. The plasma etching method as claimed in claim 2, wherein:
the second single pulse has a phase shift that is delayed with respect to the first single pulse and the main pulse, and
a duty cycle of the second single pulse is less than a duty cycle of the first single pulse and less than a duty cycle of the main pulse.

7. The plasma etching method as claimed in claim 1, wherein
the source power has a first frequency of about 60 MHz,
the first bias power has a second frequency of about 2 MHz, and
the second bias power has a third frequency of about 400 KHz.

8. The plasma etching method as claimed in claim 7, wherein the source power includes a two-level pulse having a high-level duration and a low-level duration that has a power less than a power of the high-level duration.

9. The plasma etching method as claimed in claim 8, further comprising matching an impedance of the source power with an impedance of the plasma, wherein matching the impedance of the source power with the impedance of the plasma includes:
obtaining a first impedance by providing the first single pulse of the source power;
obtaining a second impedance by providing the two-level pulse of the source power; and
comparing the first impedance and the second impedance with each other to obtain an impedance difference.

10. The plasma etching method as claimed in claim 9, wherein matching the impedance of the source power with the impedance of the plasma further includes:

tuning the first frequency of the source power in the low-level duration of the two-level pulse to obtain a first capacitance that removes an imaginary part of the impedance difference;

calculating a second capacitance that removes a real part of the impedance difference; and matching the second impedance of the two-level pulse with the impedance of the plasma using the first capacitance and the second capacitance.

11. A plasma etching method, comprising:

providing a source power having a first pulse;

providing a first bias power having a second pulse that is synchronized with the first pulse; and providing a second bias power having a third pulse that is synchronized with the first and second pulses, wherein:

at least one of the first to third pulses has a pulse inclination, at least one of the first to third pulses has an inclined duration and a flat duration, the inclined duration being generated due to the pulse inclination, the flat duration being arranged continuously with the inclined duration, and the inclined duration has a power greater than half a power of the flat duration and less than the power of the flat duration.

12. The plasma etching method as claimed in claim 11, wherein the pulse inclination includes:

an upward inclination; and a downward inclination different from the upward inclination.

13. The plasma etching method as claimed in claim 11, wherein the inclined duration is about 0.55 to 0.65 times the flat duration.

14. The plasma etching method as claimed in claim 11, wherein the inclined duration includes:

an upward duration ahead of the flat duration; and a downward duration behind the flat duration.

15. The plasma etching method as claimed in claim 14, wherein the upward duration has a time period the same as a time period of the downward duration.

16. The plasma etching method as claimed in claim 11, wherein the first pulse is a two-level pulse.

17. The plasma etching method as claimed in claim 16, wherein the two-level pulse includes:

a low-level duration;

a high-level duration higher than the low-level duration; and a first inclined duration between the low-level duration and the high-level duration, the first inclined duration having the pulse inclination.

18. The plasma etching method as claimed in claim 11, wherein the second pulse includes:

a first pulse-off duration; and a first pulse-on duration higher than the first pulse-off duration; and a second inclined duration between the first pulse-off duration and the first pulse-on duration.

19. The plasma etching method as claimed in claim 11, wherein the third pulse includes:

a second pulse-off duration;

a second pulse-on duration higher than the second pulse-off duration; and a second inclined duration between the second pulse-off duration and the second pulse-on duration, the second inclined duration having the pulse inclination.

20. The plasma etching method as claimed in claim 11, wherein each of the first to third pulses has a duty cycle of about 50%.

* * * * *